(12) United States Patent
Matsuo et al.

(10) Patent No.: US 8,803,421 B2
(45) Date of Patent: Aug. 12, 2014

(54) DISPLAY WITH ORGANIC LIGHT EMITTING ELEMENTS

(71) Applicant: Sony Corporation, Tokyo (JP)

(72) Inventors: Keisuke Matsuo, Kanagawa (JP); Chiyoko Sato, Kanagawa (JP); Kohji Hanawa, Kanagawa (JP); Takanori Shibasaki, Aichi (JP); Tetsuro Yamamoto, Kanagawa (JP); Kiwamu Miura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/910,732

(22) Filed: Jun. 5, 2013

(65) Prior Publication Data

US 2013/0341603 A1     Dec. 26, 2013

Related U.S. Application Data

(63) Continuation of application No. 13/424,927, filed on Mar. 20, 2012, now Pat. No. 8,587,195, which is a continuation of application No. 12/045,235, filed on Mar. 10, 2008, now Pat. No. 8,232,720.

(30) Foreign Application Priority Data

Mar. 14, 2007   (JP) .................................. 2007-064787

(51) Int. Cl.
  *H01L 51/00*   (2006.01)
  *H01L 27/32*   (2006.01)
  *H01L 51/56*   (2006.01)

(52) U.S. Cl.
  CPC ........ *H01L 27/3206* (2013.01); *H01L 27/3283* (2013.01); *H01L 51/0013* (2013.01); *H01L 27/3211* (2013.01); *H01L 27/3246* (2013.01); *H01L 51/56* (2013.01)
  USPC ............................................ 313/506; 313/512

(58) Field of Classification Search
  USPC .................................................. 313/498–512
  See application file for complete search history.

(56) References Cited

U.S. PATENT DOCUMENTS

| | | | |
|---|---|---|---|
| 6,246,179 B1 | 6/2001 | Yamada | |
| 6,887,650 B2 | 5/2005 | Shimoda et al. | |
| 2004/0178722 A1* | 9/2004 | Cok et al. | 313/506 |
| 2006/0145147 A1 | 7/2006 | Kang et al. | |
| 2006/0158111 A1 | 7/2006 | Hayashi | |
| 2006/0243377 A1 | 11/2006 | Matsuo et al. | |

FOREIGN PATENT DOCUMENTS

| | | |
|---|---|---|
| JP | 2003-168569 | 6/2003 |
| JP | 2004-134404 | 4/2004 |
| JP | 2005347275 | 12/2005 |
| JP | 2006-309994 | 11/2006 |
| JP | 2006309994 | 11/2006 |

OTHER PUBLICATIONS

Japanese Office Action (JP 2007-064787) issued on Jul. 14, 2009.
Japanese Office Action issued Jan. 9, 2012 in corresponding Taiwan Patent Application No. 97106268.

* cited by examiner

*Primary Examiner* — Anne Hines
(74) *Attorney, Agent, or Firm* — K&L Gates LLP

(57) ABSTRACT

Disclosed herein is a display including an acceptor substrate having thereon a red light-emitting element column, a green light-emitting element column, and a blue light-emitting element column that are arranged along a row direction and are each obtained by arranging rectangular organic light-emitting elements for generating light of one of red, green, and blue along a longitudinal direction of the organic light-emitting elements.

6 Claims, 26 Drawing Sheets

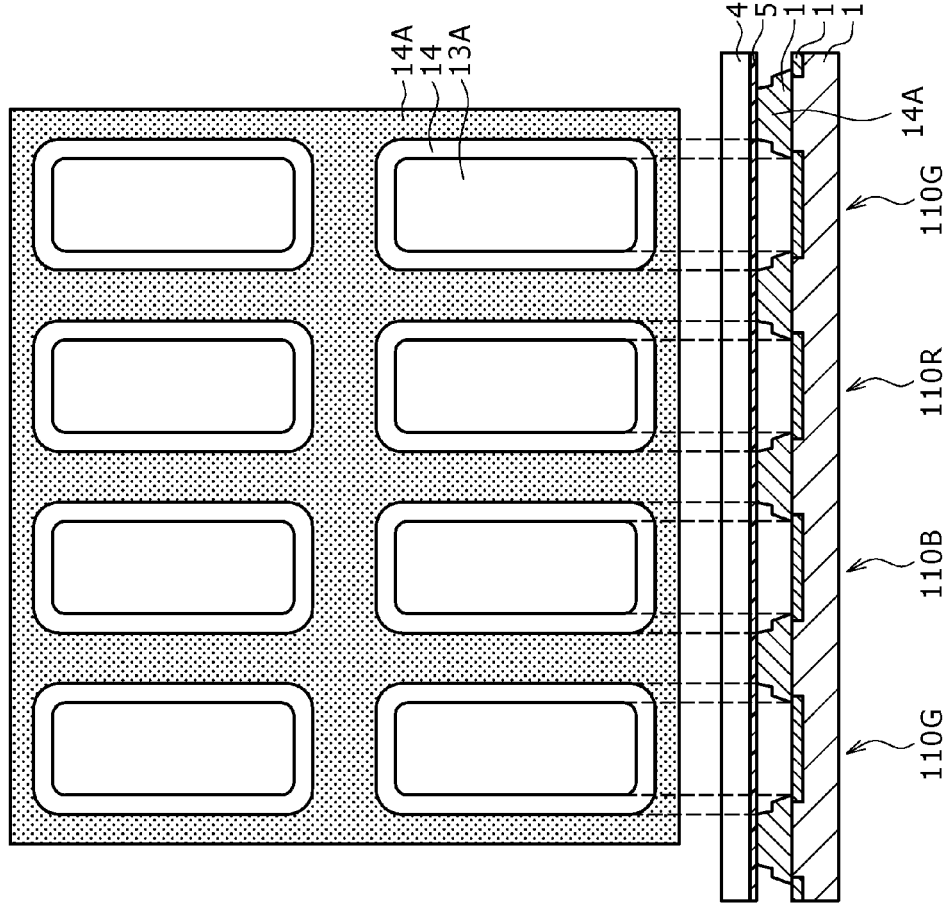

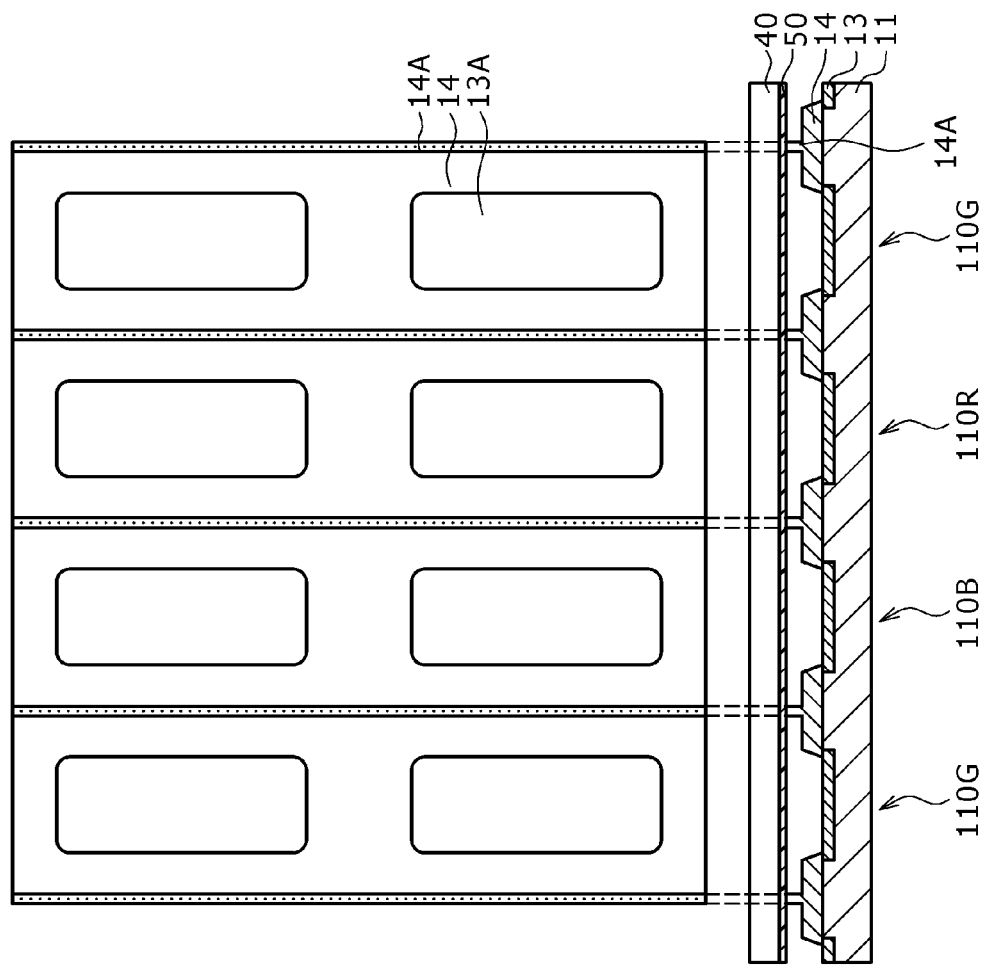

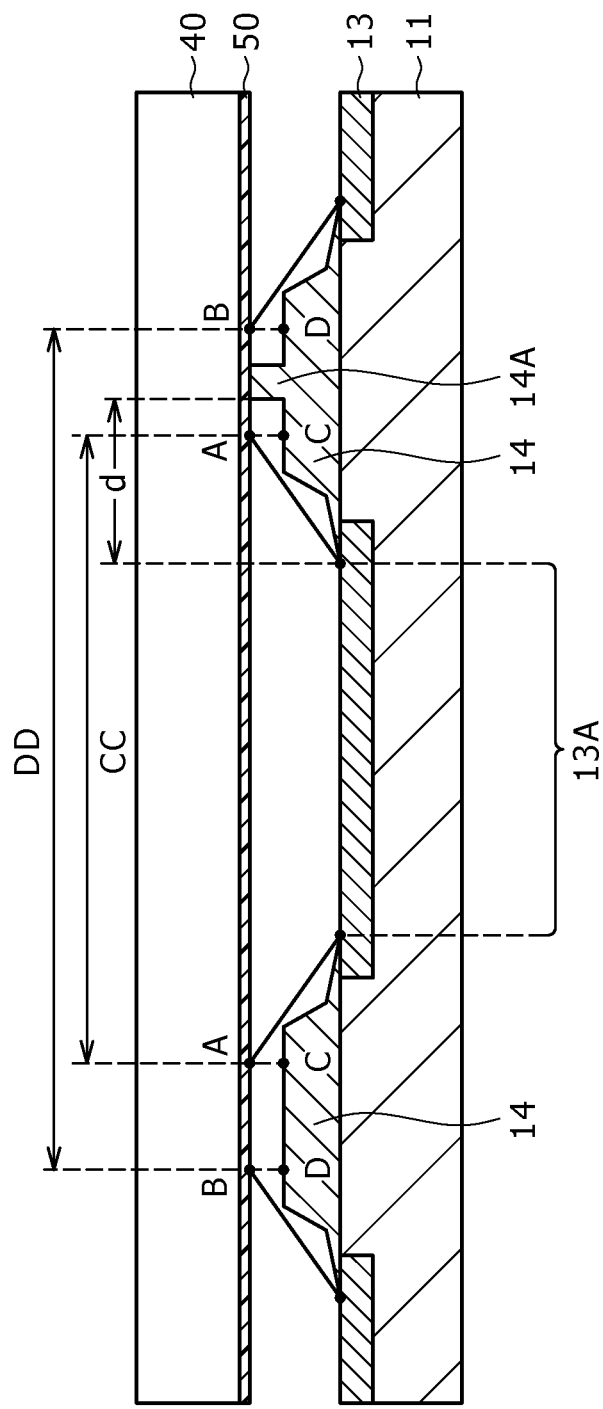

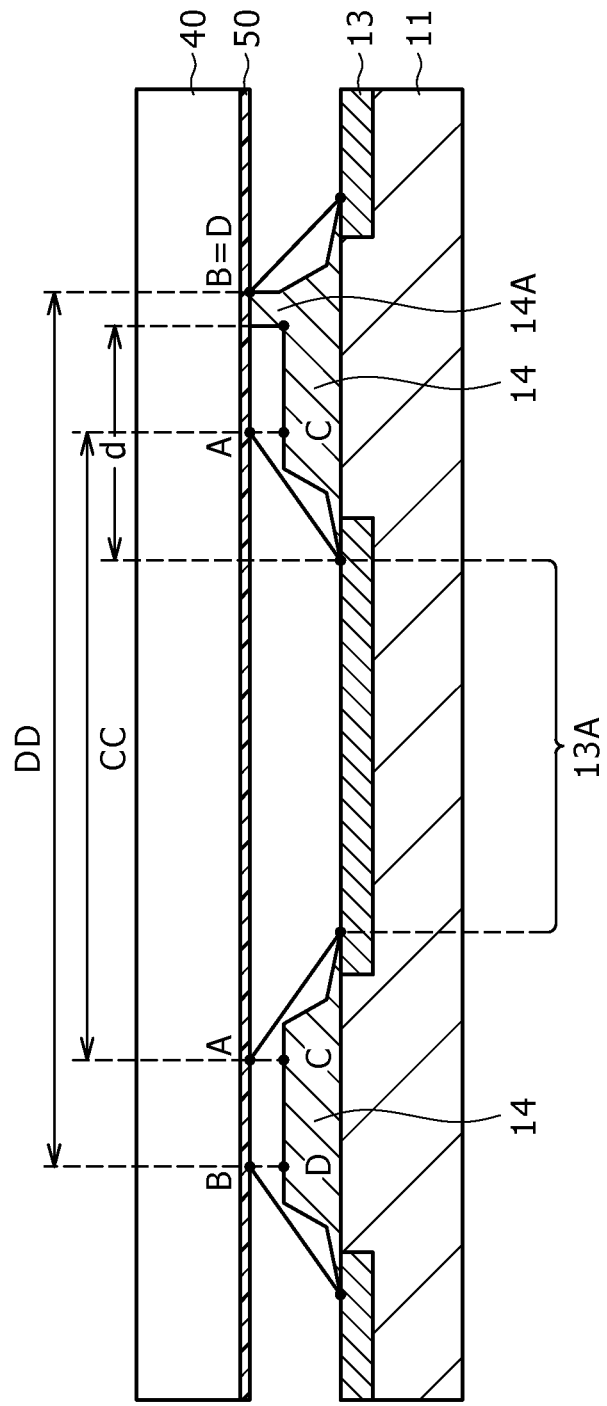

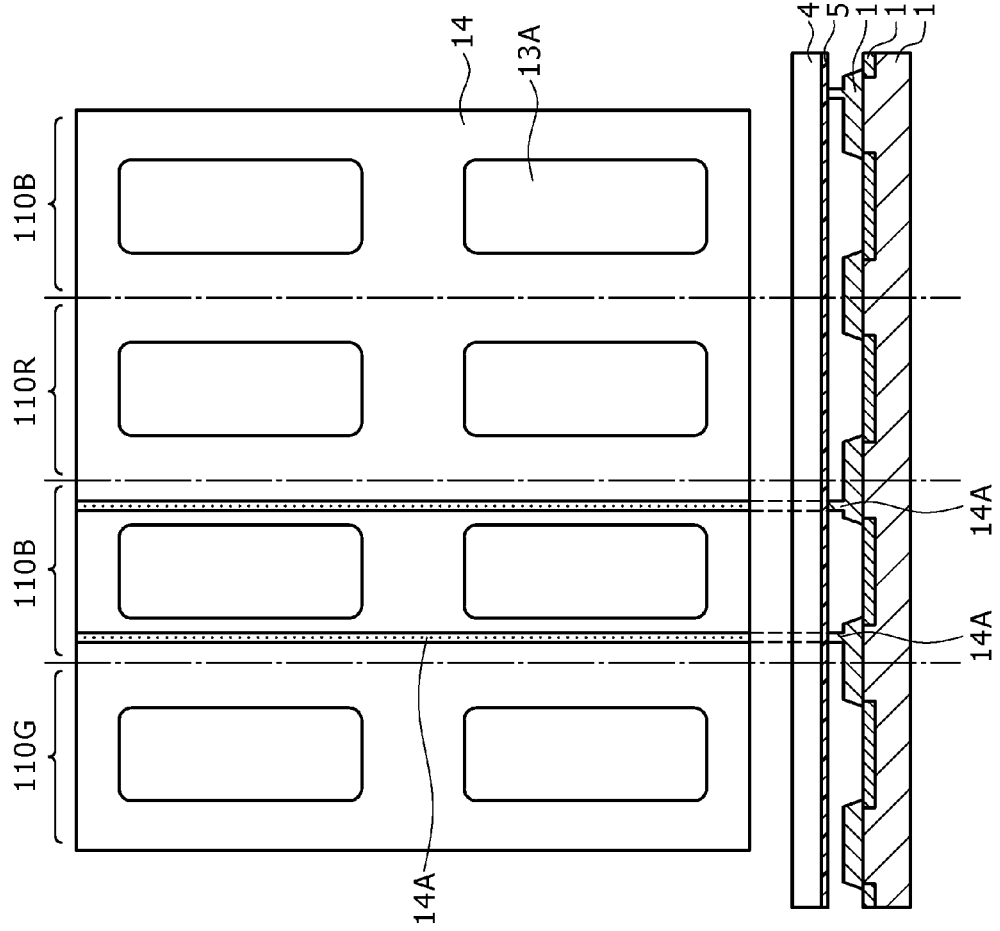

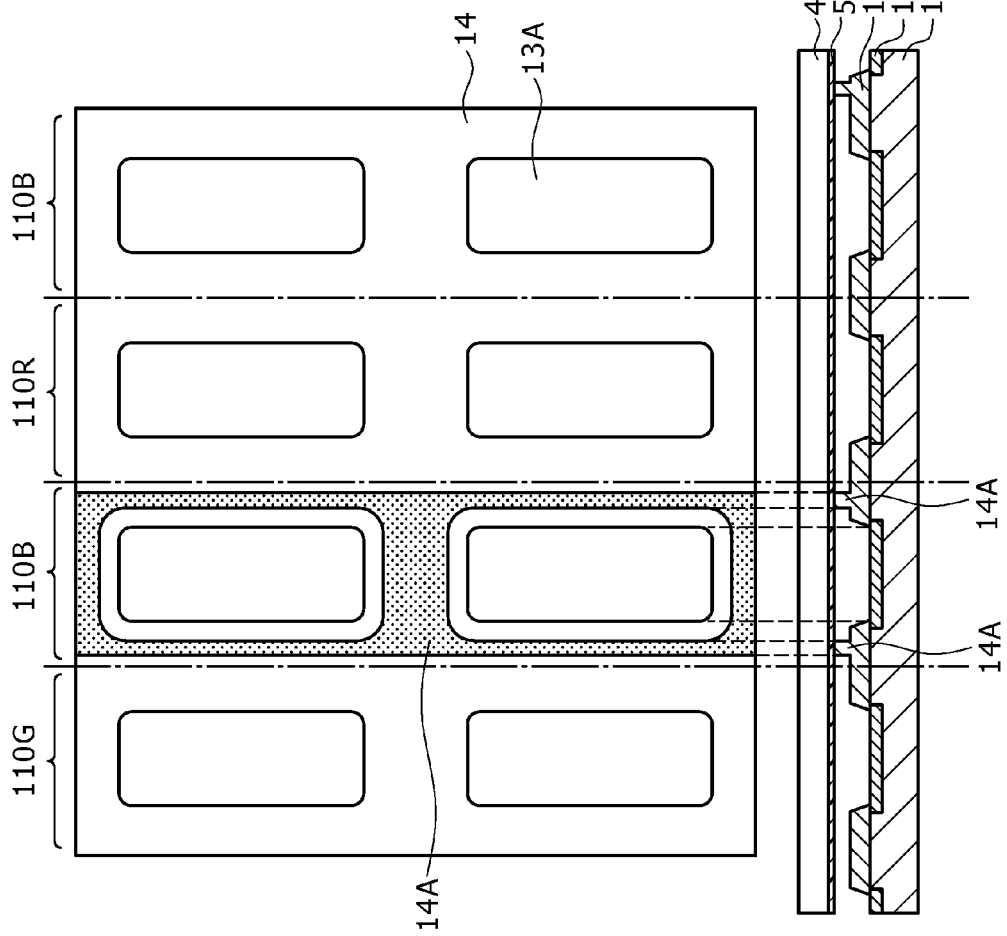

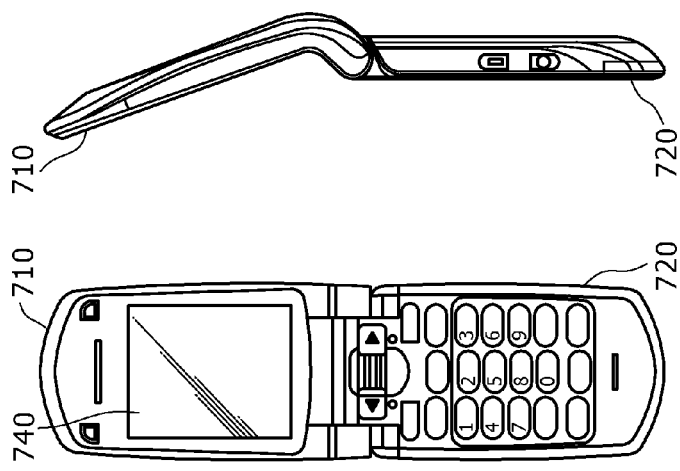
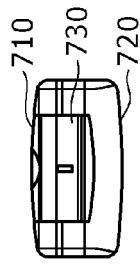
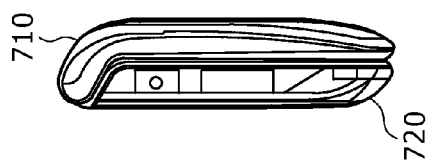
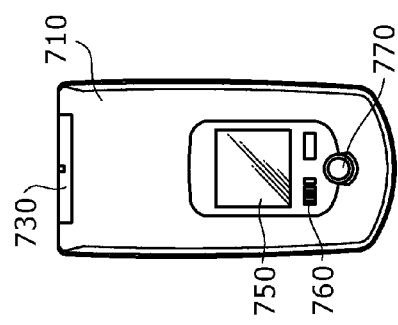
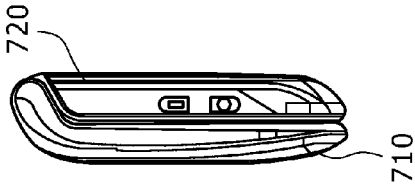
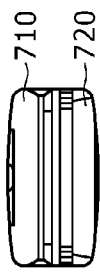

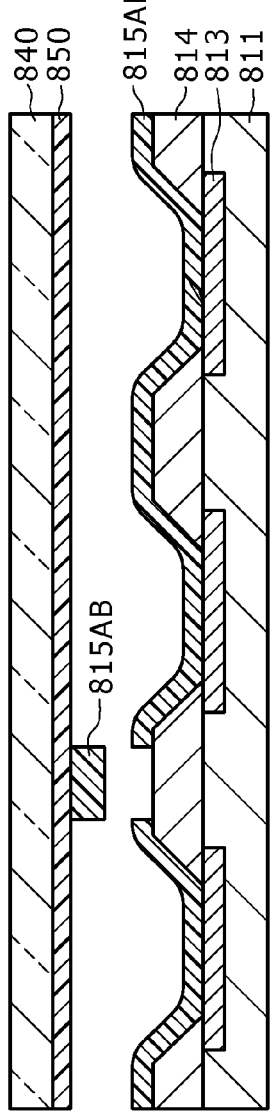
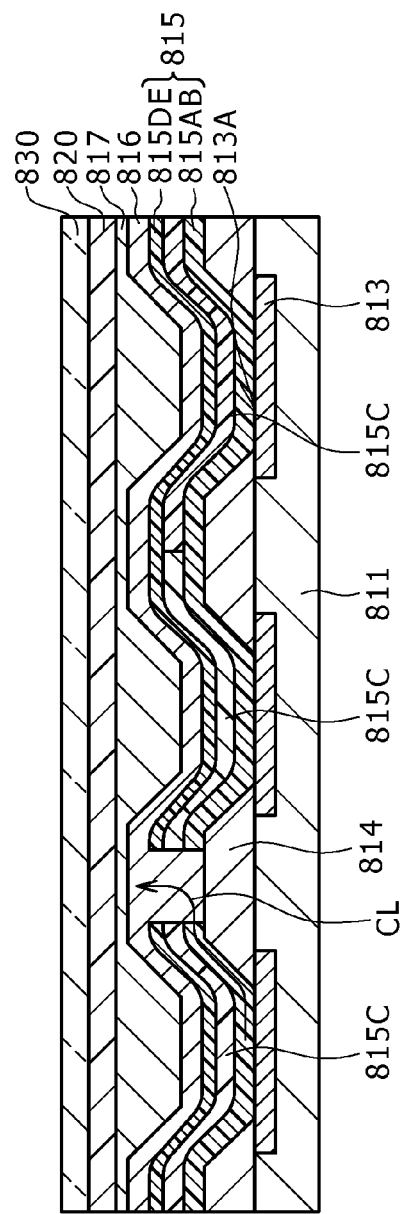
FIG.30A
FIG.30B

DISPLAY WITH ORGANIC LIGHT EMITTING ELEMENTS

CROSS REFERENCES TO RELATED APPLICATIONS

The present application is a continuation of U.S. application Ser. No. 13/424,927, which is a continuation of U.S. application Ser. No. 12/045,235 filed Mar. 10, 2008 and issued as U.S. Pat. No. 8,232,720, which claims priority related to Japanese Patent Application JP 2007-064787 filed in the Japan Patent Office on Mar. 14, 2007, the entire contents of which being incorporated herein by reference.

BACKGROUND

The present application relates to a display that employs organic light-emitting elements having a transferred light-emitting layer obtained by a thermal transfer method.

As one of manufacturing methods for an organic light-emitting element, a pattern fabrication method employing thermal transfer has been disclosed. In the thermal transfer method, a donor component arising from formation of a transfer layer containing a light-emitting material over a support is formed. Subsequently, this donor component is disposed to face an acceptor substrate for forming an organic light-emitting element, and the transfer layer is transferred to the acceptor substrate by irradiation with a radiant ray under a low-pressure environment. As the support, a rigid material such as glass is used in some cases (refer to e.g. Japanese Patent Laid-Open No. 2006-309994 (Patent document 1)), and a flexible film is used in other cases (refer to e.g. Japanese Patent Laid-Open No. 2003-168569 (Patent document 2)). In the latter cases, the transfer is carried out in such a way that the donor component is brought into complete contact with an electrode over the acceptor substrate. In the former cases, an insulating layer for defining a light-emission area is provided over the acceptor substrate. Subsequently, the irradiation with a radiant ray is performed in the state in which the donor substrate is separated from the acceptor substrate by the distance equivalent to the height of this insulating layer, to thereby sublime or evaporate the transfer layer, so that the transfer layer is transferred to the acceptor substrate.

However, as described in Patent document 1, if a rigid material such as glass is used as the support of the donor component, there is room for improvement in the size and shape of the insulating layer for defining the light-emission area and the width and position of the transfer pattern, for suppression of the distribution of the film thickness of the transferred light-emitting layer in the light-emission area and color mixing into an adjacent light-emission area.

In Japanese Patent Laid-Open No. 2003-168569, countermeasures against a fringe pattern in a transfer method of subliming or evaporating a transfer layer are disclosed. However, fundamental measures to suppress the distribution of the film thickness of the transferred light-emitting layer in the light-emission area and to prevent color mixing are not described in this document.

Furthermore, there is a fear that so-called reverse transfer occurs in the transfer step as shown in FIG. 30A. Specifically, in the transfer step, a donor substrate 840 on which a transfer layer 850 is formed is brought into tight contact with, by using pressure difference from the atmospheric pressure, an acceptor substrate 811 over which a first electrode 813, an insulating layer 814, and a hole injection layer and hole transport layer 815AB are formed. Therefore, the tight-contact pressure by the donor substrate 840 possibly causes pressure-transfer of the already-deposited hole injection layer and hole transport layer 815AB. Such a reverse transfer phenomenon readily occurs when heating by laser light at the time of the transfer is added to the pressuring by the donor substrate 840. If the reverse transfer occurs, the deposited surface of the hole injection layer and hole transport layer 815AB over the acceptor substrate 811 is disturbed, and thus current leakage CL through the defect resulting from the reverse transfer will occur as shown in FIG. 30B. This current leakage CL problematically causes streak unevenness and mottled unevenness at the time of the lighting of the display. For this reason, assured suppression of the reverse transfer is desired.

SUMMARY

The present application in an embodiment provides a display that has suppressed distribution of the film thickness of a transferred light-emitting layer in a light-emission area and enhanced display quality.

According to an embodiment, there is provided a display including an acceptor substrate configured to have thereon a red light-emitting element column, a green light-emitting element column, and a blue light-emitting element column that are arranged along the row direction and are each obtained by arranging rectangular organic light-emitting elements for generating light of one of red, green, and blue along the longitudinal direction of the organic light-emitting elements. The organic light-emitting element includes a first electrode, an insulating layer having an aperture corresponding to a light-emission area of the first electrode, an organic layer that includes a light-emitting layer and is formed at least on the light-emission area, and a second electrode. The light-emitting layer in at least the red light-emitting element column and the green light-emitting element column is a transferred light-emitting layer formed by disposing the acceptor substrate over which the first electrode and the insulating layer are formed and a donor substrate over which a transfer layer containing a light-emitting material is formed in such a way that the acceptor substrate and the donor substrate face each other with the intermediary of the insulating layer therebetween, and carrying out irradiation with a radiant ray to sublime or evaporate the transfer layer to thereby transfer the transfer layer at least onto the light-emission area. If the intersection of the tangent to the insulating layer drawn from an end of the light-emission area with the surface of the donor substrate is A and the intersection of the perpendicular line to the acceptor substrate drawn down from the A with the surface of the insulating layer is C, the transferred light-emitting layer includes the C. The term "tangent" refers to the tangent to the insulating layer drawn from an end of the light-emission area as described above if the side surface of the insulating layer is an inclined surface or a convex surface. In contrast, if the side surface of the insulating layer is a concave surface, the "tangent" refers to the straight line connecting an end of the light-emission area with the position protruding toward the light-emission area at the most degree among the positions on the side surface of the insulating layer.

In the display according an embodiment, under the definition that the intersection of the tangent to the insulating layer drawn from the end of the light-emission area with the surface of the donor substrate is A and the intersection of the perpendicular line to the acceptor substrate drawn down from A with the surface of the insulating layer is C, the transferred light-emitting layer includes C. This feature provides narrowed distribution of the film thickness of the transferred light-emitting layer in the light-emission area. Thus, luminance unevenness, color unevenness, the lowering of the light-emission efficiency, and so on are suppressed, which enhances the display quality.

Additional features and advantages are described herein, and will be apparent from the following Detailed Description and the figures.

BRIEF DESCRIPTION OF THE FIGURES

FIGS. 12A and 12B are sectional views showing yet another modification example of the insulating layer shown in FIG. 5;

FIGS. 13A and 13B are sectional views showing yet another modification example of the insulating layer shown in FIG. 5;

FIG. 16 is a sectional view showing yet another modification example of the insulating layer shown in FIG. 5;

FIG. 17 is a sectional view showing yet another modification example of the insulating layer shown in FIG. 5;

FIGS. 18A and 18B are sectional views showing the shape of an insulating layer in a display according to a second embodiment;

FIGS. 19A and 19B are sectional views showing a modification example of the insulating layer shown in FIGS. 18A and 18B;

FIGS. 29A to 29G are diagrams showing Application example 5 of the display; A and B are a front view and side view, respectively, of the opened state, and C, D, E, F, and G are a front view, left-side view, right-side view, top view, and bottom view, respectively, of the closed state; and FIGS. 30A and 30B are diagrams for explaining problems of a related-art transfer method.

DETAILED DESCRIPTION

Figure 1:
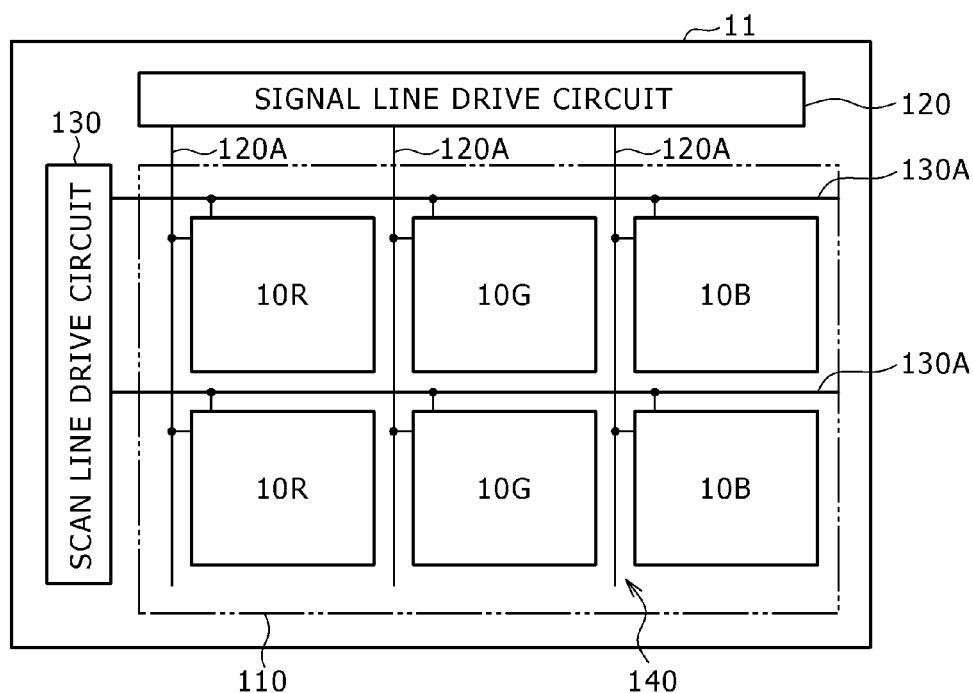
FIG. 1 is a diagram showing the configuration of a display according to a first embodiment.

Embodiments of the present application will be described in detail below with reference to the accompanying drawings First Embodiment FIG. 1 shows the configuration of a display according to a first embodiment of the present invention. This display is used as an extremely-thin organic light-emitting color display or the like. For example, for this display, a display area 110 in which plural organic light-emitting elements 10R, 10G, and 10B, which will be described later, are arranged in a matrix is formed on an acceptor substrate 11 composed of glass. Furthermore, around this display area 110, a signal line drive circuit 120 and a scan line drive circuit 130 are formed as drivers for video displaying.

Figure 2:
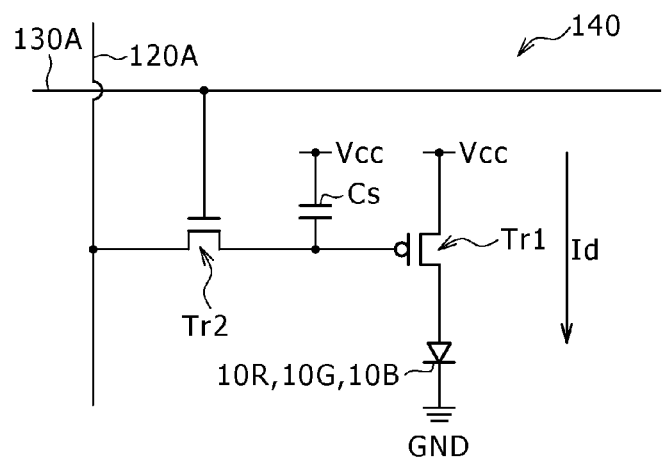
FIG. 2 is a diagram showing one example of a pixel drive circuit shown in FIG. 1.

Pixel drive circuits 140 are formed in the display area 110. FIG. 2 shows one example of the pixel drive circuit 140. This pixel drive circuit 140 is formed below a first electrode 13, which will be described later, and is an active-type drive circuit that includes a drive transistor Tr1, a write transistor Tr2, a capacitor (holding capacitor) Cs between these transistors, and an organic light-emitting element 10R (or 10G, 10B) connected in series to the drive transistor Tr1 between a first power supply line (Vcc) and a second power supply line (GND). The drive transistor Tr1 and the write transistor Tr2 are formed of a general thin film transistor (TFT). The structures of these transistors are not particularly limited: these transistors may have either a reverse-stagger structure (so-called bottom-gate structure) or a stagger structure (top-gate structure) for example.

For the pixel drive circuits 140, plural signal lines 120A are disposed along the column direction and plural scan lines 130A are disposed along the row direction. Each of the intersections of the signal lines 120A with the scan lines 130A corresponds to any one of the organic light-emitting elements 10R, 10G, and 10B (sub-pixel). Each signal line 120A is connected to the signal line drive circuit 120. From this signal line drive circuit 120, image signals are supplied to the source electrodes of the write transistors Tr2 via the signal lines 120A. Each scan line 130A is connected to the scan line drive circuit 130. From this scan line drive circuit 130, scan signals are sequentially supplied to the gate electrodes of the write transistors Tr2 via the scan lines 130A.

Figure 3:
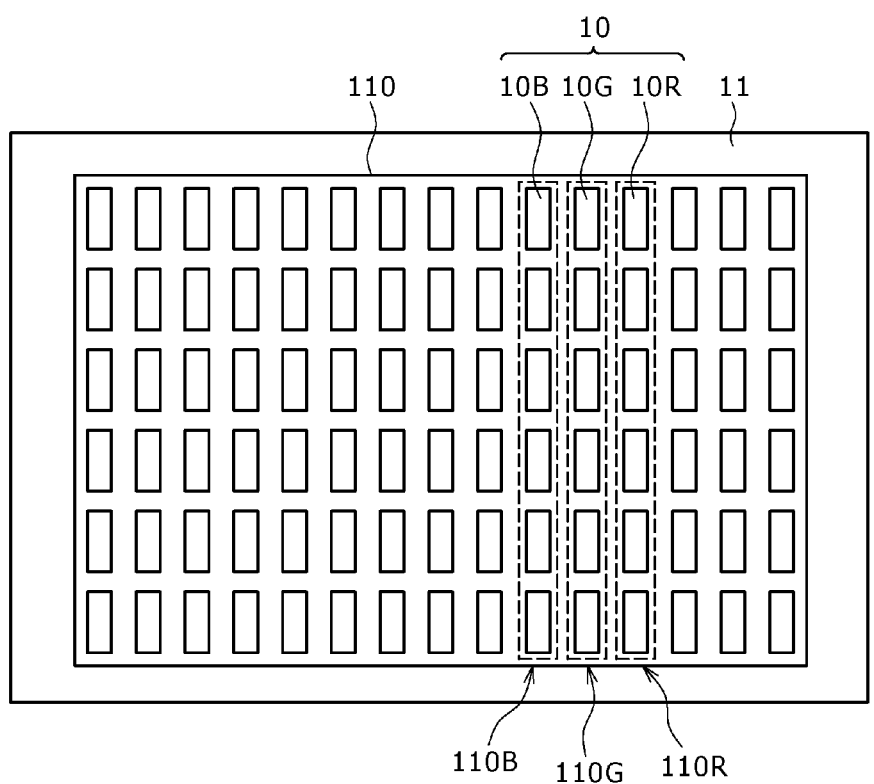
FIG. 3 is a plan view showing the configuration of a display area shown in FIG. 1.

FIG. 3 shows one example of the planar configuration of the display area 110. In the display area 110, the organic light-emitting elements 10R for generating red light, the organic light-emitting elements 10G for generating green light, and the organic light-emitting elements 10B for generating blue light are in turn formed into a matrix as a whole. The organic light-emitting elements 10R, 10G, and 10B each have a rectangular planar shape, and form red light-emitting element columns 110R, green light-emitting element columns 110G, and blue light-emitting element columns 110B arising from arrangement of the elements along the longitudinal direction of the elements (column direction). These red light-emitting element columns 110R, green light-emitting element columns 110G, and blue light-emitting element columns 110B are arranged along the row direction in the display area 110. The combination of the adjacent organic light-emitting elements 10R, 10G, and 10B serves as one pixel 10. The pixel pitch is e.g. 300 µm.

Figure 4:
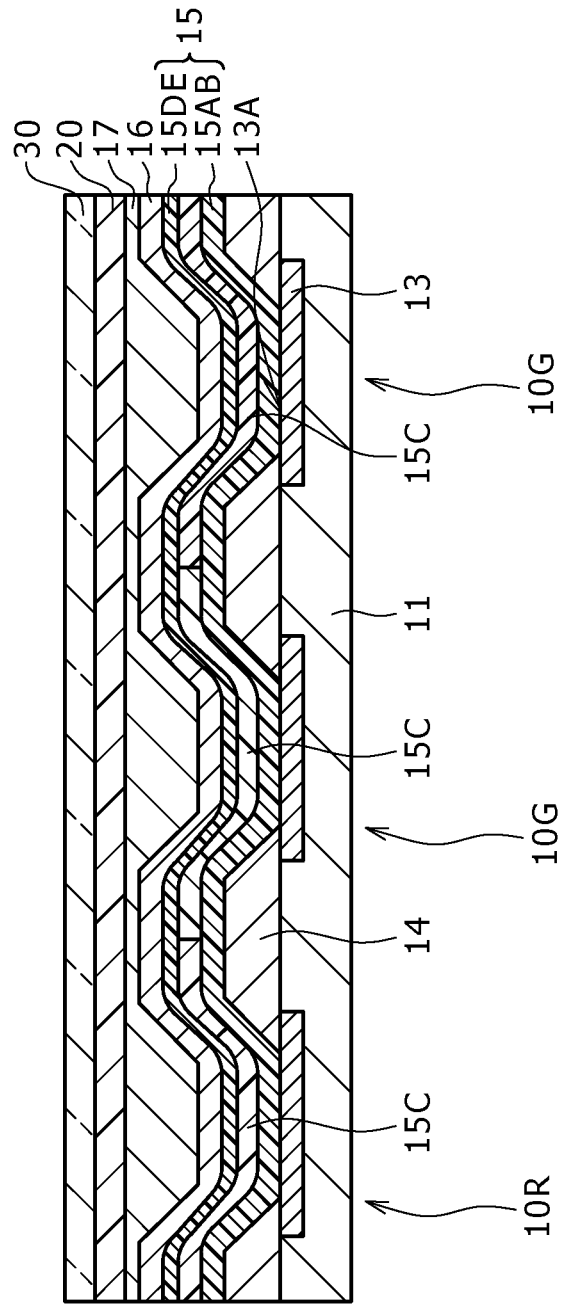
FIG. 4 is a sectional view showing the configuration of organic light-emitting elements shown in FIG. 3.

FIG. 4 shows the sectional configuration of the organic light-emitting elements 10R, 10G, and 10B shown in FIG. 3. Each of the organic light-emitting elements 10R, 10G, and 10B has a configuration obtained by stacking the first electrode 13 as the anode, an insulating layer 14, an organic layer 15 including a light-emitting layer 15C to be described later, and a second electrode 16 as the cathode in that order from the substrate side with the intermediary of the drive transistor in the above-described pixel drive circuit 140 (not shown) and a planarization insulating film (not shown).

The organic light-emitting elements 10R, 10G, and 10B are covered by a protective film 17 composed of a silicon nitride (SiNx). Furthermore, a sealing substrate 30 composed of glass or the like is bonded across the entire surface over this protective film 17 with the intermediary of an adhesive layer 20, so that the organic light-emitting elements 10R, 10G, and 10B are sealed.

The first electrode 13 is composed of e.g. ITO (indium-tin composite oxide).

The insulating layer 14 is to assure insulation between the first electrodes 13 and the second electrode 16 and allow the light-emission areas to have a desired shape accurately. The insulating layer 14 is composed of e.g. photosensitive resin such as polyimide. In the insulating layer 14, apertures are provided corresponding to light-emission areas 13A of the first electrodes 13. The organic layer 15 and the second electrode 16 may be provided not only over the light-emission areas 13A but also over the insulating layer 14 continuously. However, light emission occurs only in the apertures of the insulating layer 14.

The organic layer 15 has a configuration obtained by stacking a hole injection layer and hole transport layer 15AB, the light-emitting layer 15C, and an electron transport layer and electron injection layer 15DE in that order from the first electrode side. However, the provision of the layers other than the light-emitting layer 15C is according to need. The organic layer 15 may have different configurations depending on the colors of light emitted by the organic light-emitting elements 10R, 10G, and 10B. The hole injection layer is to enhance the hole injection efficiency, and is a buffer layer for preventing leakage. The hole transport layer is to enhance the efficiency of hole transportation to the light-emitting layer 15C. In the light-emitting layer 15C, the recombination between electrons and holes occurs and thus light is generated in response to electric field application. The electron transport layer is to enhance the efficiency of electron transportation to the light-emitting layer 15C. The electron injection layer has a thickness of e.g. about 0.3 nm and is composed of LiF, $Li_2O$, or the like. In FIG. 4, the hole injection layer and the hole transport layer are represented as one layer (the hole injection layer and hole transport layer 15AB), and the electron transport layer and the electron injection layer are represented as one layer (the electron transport layer and electron injection layer 15DE).

The hole injection layer of the organic light-emitting element 10R has a thickness in the range of 5 nm to 300 nm, and is composed of 4,4',4"-tris(3-methylphenylphenylamino)triphenylamine (m-MTDATA) or 4,4',4"-tris(2-naphthylphenylamino)triphenylamine (2-TNATA), for example. The hole transport layer of the organic light-emitting element 10R has a thickness in the range of 5 nm to 300 nm, and is composed of bis[(N-naphthyl)-N-phenyl]benzidine (α-NPD), for example. The light-emitting layer 15C of the organic light-emitting element 10R has a thickness in the range of 10 nm to 100 nm, and is composed of 9,10-di-(2-naphthyl)anthracene (ADN) doped with 30-wt. % 2,6=bis[(4'=methoxydiphenylamino)styryl]=1,5=dicyanonaphthalene (BSN), for example. The electron transport layer of the organic light-emitting element 10R has a thickness in the range of 5 nm to 300 nm, and is composed of 8=hydroxyquinoline aluminum ($Alq_3$), for example.

The hole injection layer of the organic light-emitting element 10G has a thickness in the range of 5 nm to 300 nm, and is composed of m-MTDATA or 2-TNATA, for example. The hole transport layer of the organic light-emitting element 10G has a thickness in the range of 5 nm to 300 nm, and is composed of α-NPD, for example. The light-emitting layer 15C of the organic light-emitting element 10G has a thickness in the range of 10 nm to 100 nm, and is composed of ADN doped with 5-wt. % coumarin 6, for example. The electron transport layer of the organic light-emitting element 10G has a thickness in the range of 5 nm to 300 nm, and is composed of $Alq_3$, for example.

The hole injection layer of the organic light-emitting element 10B has a thickness in the range of 5 nm to 300 nm, and is composed of m-MTDATA or 2-TNATA, for example. The hole transport layer of the organic light-emitting element 10B has a thickness in the range of 5 nm to 300 nm, and is composed of α-NPD, for example. The light-emitting layer 15C of the organic light-emitting element 10B has a thickness in the range of 10 nm to 100 nm, and is composed of ADN doped with 2.5-wt. % 4,4'=bis[2={4=(N,N=diphenylamino)phenyl}vinyl]biphenyl (DPAVBi), for example. The electron transport layer of the organic light-emitting element 10B has a thickness in the range of 5 nm to 300 nm, and is composed of $Alq_3$, for example.

Figure 5:
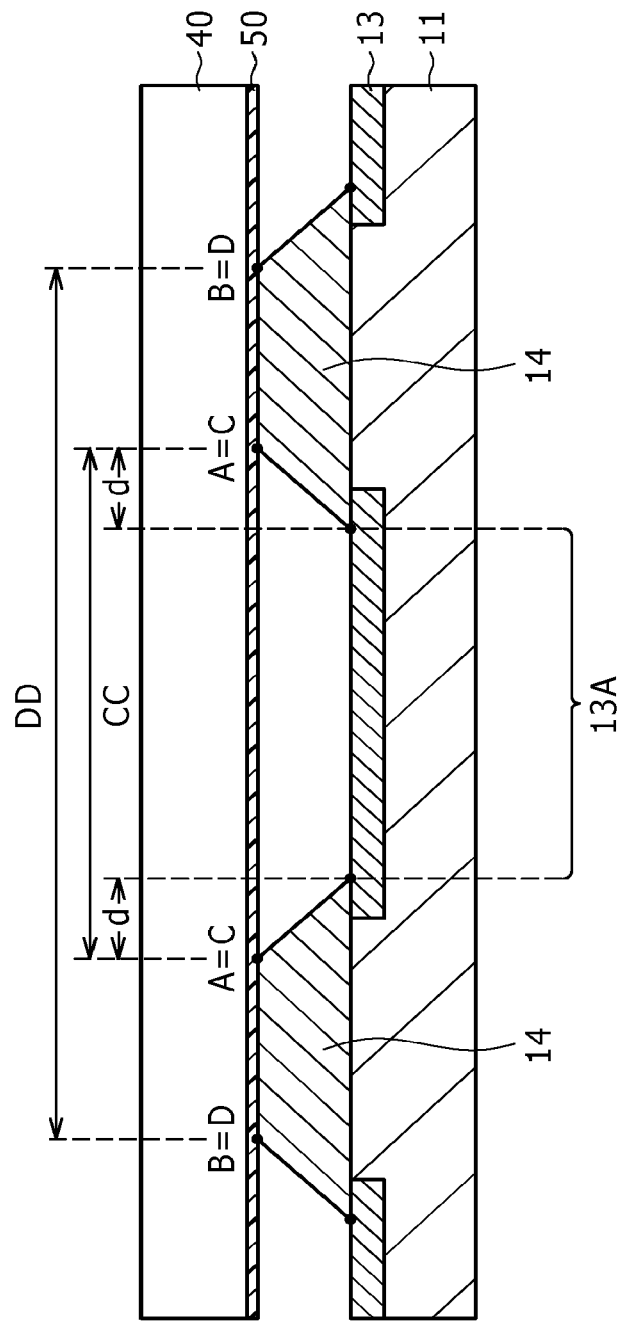
FIG. 5 is a sectional view showing an intermediate step in a method for manufacturing the display shown in FIG. 1, and showing the positional relationship between an acceptor substrate and a donor substrate.
Figure 6:
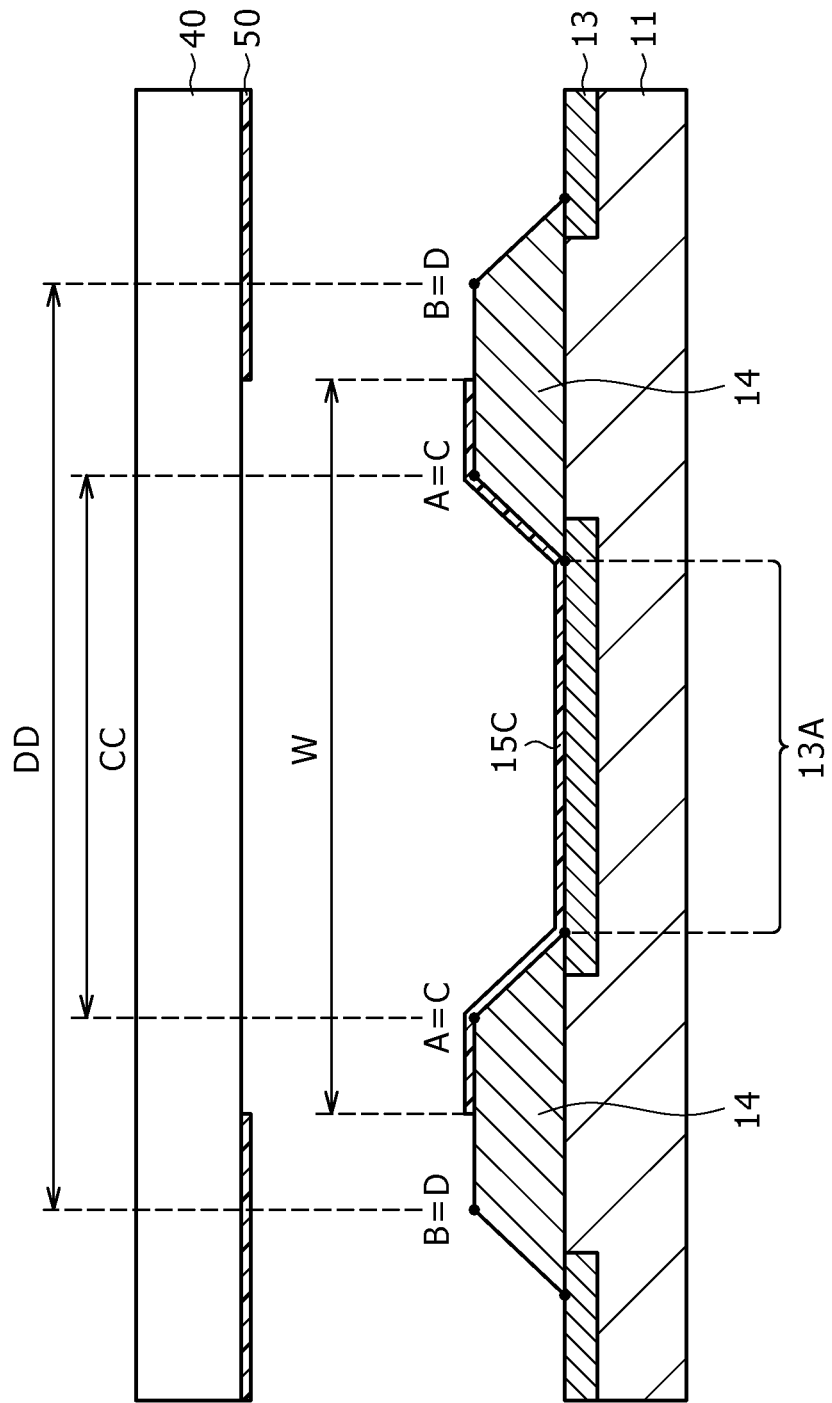
FIG. 6 is a sectional view showing a step subsequent to the step of FIG. 5, and showing the positional relationship among a light-emitting layer of an organic light-emitting element, a light-emission area of a first electrode, and an insulating layer.

FIGS. 5 and 6 show the positional relationship among the light-emitting layer 15C of the organic light-emitting elements 10R, 10G, and 10B, the light-emission area 13A of the first electrode 13, and the insulating layer 14. As described later, the light-emitting layer 15C of the organic light-emitting elements 10R, 10G, and 10B is a transferred light-emitting layer formed as follows. Specifically, the acceptor substrate 11 over which the first electrodes 13 and the insulating layer 14 have been formed and a donor substrate 40 on which a transfer layer 50 containing a light-emitting material has been formed are disposed to face each other with the intermediary of the insulating layer 14 therebetween. In this state, irradiation with laser light is carried out to sublime or evaporate the transfer layer 50, to thereby transfer the transfer layer 50 at least onto the light-emission area 13A. Furthermore, under the definition that the intersection of the tangent to the insulating layer 14 drawn from an end of the light-emission area 13A with the surface of the donor substrate 40 is A and the intersection of the perpendicular line to the acceptor substrate 11 drawn down from A with the surface of the insulating layer 14 is C, the light-emitting layer 15C is so formed as to include C.

The second electrode 16 shown in FIG. 4 has a thickness in the range of 5 nm to 50 nm, and is composed of an elemental metal such as aluminum (Al), magnesium (Mg), calcium (Ca), or sodium (Na), or an alloy of any of these metals, for example. Among them, an alloy of magnesium and silver (MgAg alloy) and an alloy of aluminum (Al) and lithium (Li) (AlLi alloy) are preferable.

The protective film 17 shown in FIG. 4 is to prevent water and so on from entering the organic layer 15. It is composed of a material with low water permeability and low water absorption and has sufficient thickness. Furthermore, the protective film 17 has high transmittance for light generated by the light-emitting layer 15C: it is composed of a material having a transmittance of 80% or higher for example. Such a protective film 17 has a thickness in the range of about 2 μm to 3 μm, and is composed of an inorganic amorphous insulating material for example. Specifically, amorphous silicon (α-Si), amorphous silicon carbide (α-SiC), amorphous silicon nitride (α-$Si_{1-X}N_X$), and amorphous carbon (α-C) are preferable. These inorganic amorphous insulating materials include no grain and thus have low water permeability, and hence will serve as a favorable protective film 17. Alternatively, the protective film 17 may be composed of a transparent conductive material such as ITO.

The adhesive layer 20 shown in FIG. 4 is composed of e.g. heat-curable resin or UV-curable resin.

The sealing substrate 30 shown in FIG. 4 is located on the second electrode side of the organic light-emitting elements 10R, 10G, and 10B. It is to seal the organic light-emitting elements 10R, 10G, and 10B together with the adhesive layer 20, and is composed of a material, such as glass, having transparency for light generated by the organic light-emitting elements 10R, 10G, and 10B. The sealing substrate 30 may be provided with e.g. a color filter (not shown) so that light generated by the organic light-emitting elements 10R, 10G, and 10B may be extracted through the color filter and external light reflected by the organic light-emitting elements 10R, 10G, and 10B and interconnects among these elements may be absorbed by the color filter to thereby improve the contrast.

Although the color filter may be provided on either surface of the sealing substrate 30, it is preferable that the color filter be provided on the surface closer to the organic light-emitting elements 10R, 10G, and 10B. This is because the color filter is not exposed to the outside but can be protected by the adhesive layer 20. In addition, this is because the distance between the light-emitting layer 15C and the color filter is small and thus the occurrence of color mixing due to the entering of light emitted from the light-emitting layer 15C into the color filter of another color can be avoided. The color filter includes a red filter, green filter, and blue filter (none of them are shown in the drawing), and these filters are in turn disposed corresponding to the organic light-emitting elements 10R, 10G, and 10B.

The red, green, and blue filters are each formed into e.g. a rectangular shape without leaving a gap among the filters. Each of the red, green, and blue filters is composed of resin mixed with a pigment. Through selection of the pigment, the optical transmittance of the filter is so adjusted that the optical transmittance for the wavelength range of the intended red, green, or blue is high and the optical transmittance for the other wavelength range is low.

This display can be manufactured in the following manner for example.

Initially, the acceptor substrate 11 composed of the above-described material is prepared, and the pixel drive circuits 140 each including the drive transistor are formed on this acceptor substrate 11. Subsequently, the planarization insulating film is formed through applying of photosensitive resin across the entire surface, and then exposure and development are carried out to thereby pattern the film into a predetermined shape and form connection holes (not shown) for connection between the drive transistor and the first electrode 13, followed by baking.

Subsequently, the first electrodes 13 composed of the above-described material are formed by e.g. sputtering, and then are processed into a predetermined shape by e.g. dry etching. At a predetermined position on the acceptor substrate 11, an alignment mark used for alignment with a donor substrate in a transfer step to be described later is formed.

Subsequently, photosensitive resin is applied across the entire surface of the acceptor substrate 11, and then apertures are provided corresponding to the light-emission areas by e.g. photolithography, followed by baking. As a result, the insulating layer 14 is formed.

Thereafter, by e.g. evaporation, the hole injection layer and hole transport layer 15AB having the above-described thickness and is composed of the above-described material are sequentially deposited.

After the formation of the hole injection layer and hole transport layer 15AB, the light-emitting layer 15C is formed by a thermal transfer method. Specifically, as shown in FIG. 5, the acceptor substrate 11 over which the first electrodes 13 and the insulating layer 14 have been formed and the donor substrate 40 on which the transfer layer 50 containing a light-emitting material has been formed are disposed to face each other with the intermediary of the insulating layer 14 therebetween, and both the substrates are brought into tight contact with each other under a vacuum environment. Thereafter, the substrates are brought out to an atmospheric-pressure environment in such a way that the vacuum between both the surfaces is kept by using a vacuum holding frame. Thus, due to the pressure difference between the inside and outside of the substrates, the donor substrate 40 is brought into tight contact with the acceptor substrate 11 uniformly. However, the distance equivalent to the thickness (height) of the insulating layer 14 is kept between the surface of the transfer layer 50 on the donor substrate 40 and the surface of the hole injection layer and hole transport layer 15AB (not shown in FIG. 6) over the acceptor substrate 11.

Figure 7:
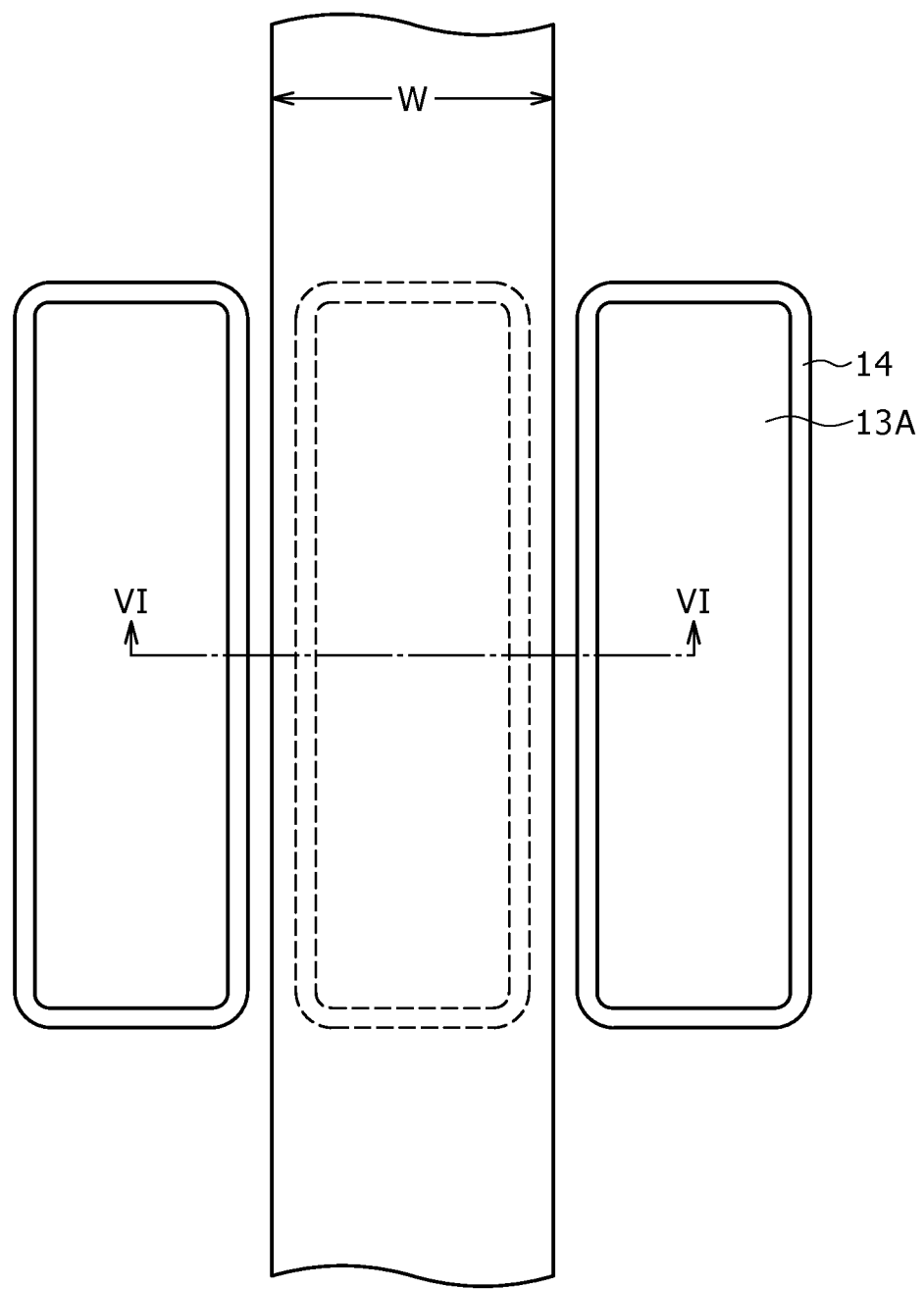
FIG. 7 is a plan view showing the light-emitting layer formed in the step shown in FIG. 6.

Subsequently, irradiation with laser light is carried out to sublime or evaporate the transfer layer 50 to thereby transfer the transfer layer 50 at least onto the light-emission area 13A. Thereby, the light-emitting layer 15C is formed as shown in FIGS. 6 and 7. At this time, under the definition that the intersection of the tangent to the insulating layer 14 drawn from an end of the light-emission area 13A with the surface of the donor substrate 40 is A and the intersection of the perpendicular line to the acceptor substrate 11 drawn down from A with the surface of the insulating layer 14 is C, the light-emitting layer 15C is so formed as to include C. This feature allows this display to have suppressed distribution of the film thickness of the light-emitting layer 15C in the light-emission area 13A and enhanced display quality.

Furthermore, under the definition that the intersection of the tangent to the insulating layer 14 drawn from an end of the next light-emission area 13A adjacent to the light-emission area 13A along the row direction with the surface of the donor substrate 40 is B and the intersection of the perpendicular line to the acceptor substrate 11 drawn down from B with the surface of the insulating layer 14 is D, it is preferable that the light-emitting layer 15C be so formed as not to include D. This is because such a formation way can suppress color mixing into the adjacent light-emission area 13A and thus can enhance the display quality.

Moreover, under the definition that the distance between the intersections C obtained on both the sides of the light-emission area 13A along the row direction is CC and the distance between the intersections D is DD, it is preferable that the width W of the light-emitting layer 15C along the row direction be set equal to or larger than CC and smaller than DD. This is because such a formation way can suppress the distribution of the film thickness of the light-emitting layer 15C in the light-emission area 13A and color mixing into the adjacent light-emission area 13A, and thus can enhance the display quality. In addition, the transfer condition such as the spot size of the laser light can be easily optimized, and thus the time necessary to determine the condition can be shortened. Moreover, the positional accuracy margin of the transfer can be predicted, and thus it is also possible to design a shape of the insulating layer 14 for enlarging the margin like modification examples to be described later.

As another feature, it is preferable that the distance d along the row direction between the end of the light-emission area 13A and the contact face between the insulating layer 14 and the donor substrate 40 (flat part of the top surface of the insulating layer 14) be set equal to or longer than 4 μm. This is because such a feature can suppress adverse effects such as streak unevenness and mottled unevenness attributed to reverse transfer.

The donor substrate 40 is obtained by forming a photothermal conversion layer (not shown) on a common substrate (not shown) for example. According to need, an absorbing layer composed of amorphous silicon or the like may be provided between the common substrate and the photothermal conversion layer in order to enhance the absorption efficiency for the laser light, and the photothermal conversion layer may be covered by a protective layer composed of silicon nitride (SiNx) or the like in order to prevent oxidation of the photothermal conversion layer. The common substrate is composed of a material, such as glass, having sufficient robustness to allow alignment with the acceptor substrate 11 and high transparency for the laser light. The photothermal conversion layer is composed of a metal material with high absorptivity, such as molybdenum (Mo), titanium (Ti), chromium (Cr), or an alloy containing any of these metals. The transfer layer 50 contains the material of the light-emitting layer 15C of the above-described organic light-emitting elements 10R, 10G, and 10B, and is formed by e.g. vacuum evaporation on the donor substrate 40 prepared.

After the formation of the light-emitting layer 15C of the organic light-emitting elements 10R, 10G, and 10B, the electron transport layer and electron injection layer 15DE and the second electrode 16 are formed by e.g. evaporation. In this manner, the organic light-emitting elements 10R, 10G, and 10B are formed.

After the formation of the organic light-emitting elements 10R, 10G, and 10B, the protective film 17 composed of the above-described material is formed on these elements. As the method for forming the protective film 17, a deposition method in which the energy of deposition particles is so low that no influence is given to the underlying layers, such as evaporation or CVD, is preferable. Furthermore, it is desirable that the formation of the protective film 17 be performed continuously to the formation of the second electrode 16 without the exposure of the second electrode 16 to the atmosphere. This is because such a formation way can suppress the deterioration of the organic layer 15 due to water and oxygen in the atmosphere. Moreover, in this film deposition of the protective film 17, it is desirable that the deposition temperature be set to a room temperature in order to prevent luminance lowering due to the deterioration of the organic layer 15 and the deposition condition be so set that the film stress is minimized in order to prevent separation of the protective film 17.

Furthermore, for example, the material of the red filter is applied by spin-coating or the like on the sealing substrate 30 composed of the above-described material, and then is patterned by a photolithography technique and baked, to thereby form the red filter. Subsequently, the blue filter and the green filter are sequentially formed similarly to the red filter.

Thereafter, the adhesive layer 20 is formed on the protective film 17, and the sealing substrate 30 is bonded to the protective film 17 with the intermediary of the adhesive layer 20. In this bonding, it is preferable that the surface of the sealing substrate 30 on which the color filter has been formed be disposed to face the organic light-emitting elements 10R, 10G, and 10B. This bonding completes the display shown in FIG. 1.

In the thus obtained display, scan signals are supplied from the scan line drive circuit 130 to the respective pixels via the gate electrodes of the write transistors Tr2, and image signals are held in the holding capacitors Cs from the signal line drive circuit 120 via the write transistors Tr2. Specifically, the drive transistors Tr1 operate depending on the signals held in the holding capacitors Cs. This applies drive currents Id to the respective organic light-emitting elements 10R, 10G, and 10B to thereby cause the recombination between holes and electrons, which results in light emission. This light is extracted through the second electrode 16, the color filter, and the sealing substrate 30.

In this display, under the definition that the intersection of the tangent to the insulating layer 14 drawn from an end of the light-emission area 13A with the surface of the donor substrate 40 is A and the intersection of the perpendicular line to the acceptor substrate 11 drawn down from A with the surface of the insulating layer 14 is, the light-emitting layer 15C is so formed as to include C. Therefore, the distribution of the film thickness of the light-emitting layer 15C in the light-emission area 13A is suppressed. Thus, luminance unevenness, color unevenness, and the lowering of the light-emission efficiency are suppressed, which enhances the display quality.

As described above, the present embodiment can achieve suppressed distribution of the film thickness of the light-emitting layer 15C in the light-emission area 13A and enhanced display quality, because the light-emitting layer 15C is so formed as to include C under the definition that the intersection of the tangent to the insulating layer 14 drawn from an end of the light-emission area 13A with the surface of the donor substrate 40 is A and the intersection of the perpendicular line to the acceptor substrate 11 drawn down from A with the surface of the insulating layer 14 is C.

Furthermore, the light-emitting layer 15C is so formed as not to include D, under the definition that the intersection of the tangent to the insulating layer 14 drawn from an end of the next light-emission area 13A adjacent to the light-emission area 13A along the row direction with the surface of the donor substrate 40 is B and the intersection of the perpendicular line to the acceptor substrate 11 drawn down from B with the surface of the insulating layer 14 is D. Therefore, color mixing into the adjacent light-emission area 13A can be suppressed, and thus the display quality can be enhanced.

Moreover, under the definition that the distance between the intersections C obtained on both the sides of the light-emission area 13A along the row direction is CC and the distance between the intersections D is DD, the width W of the light-emitting layer 15C along the row direction is set equal to or larger than CC and smaller than DD. This feature can suppress the distribution of the film thickness of the light-emitting layer 15C in the light-emission area 13A and color mixing into the adjacent light-emission area 13A, and thus can enhance the display quality. In addition, the transfer condition can be easily optimized, and thus the time necessary to determine the condition can be shortened. Moreover, the positional accuracy margin of the transfer can be predicted, and thus a shape of the insulating layer 14 for enlarging the margin can be designed like modification examples to be described later. This feature can further enhance the yield.

In addition, the distance d along the row direction between the end of the light-emission area 13A and the contact face between the insulating layer 14 and the donor substrate 40 is set equal to or longer than 4 μm. This feature can suppress adverse effects such as streak unevenness and mottled unevenness attributed to reverse transfer.

Figure 8:
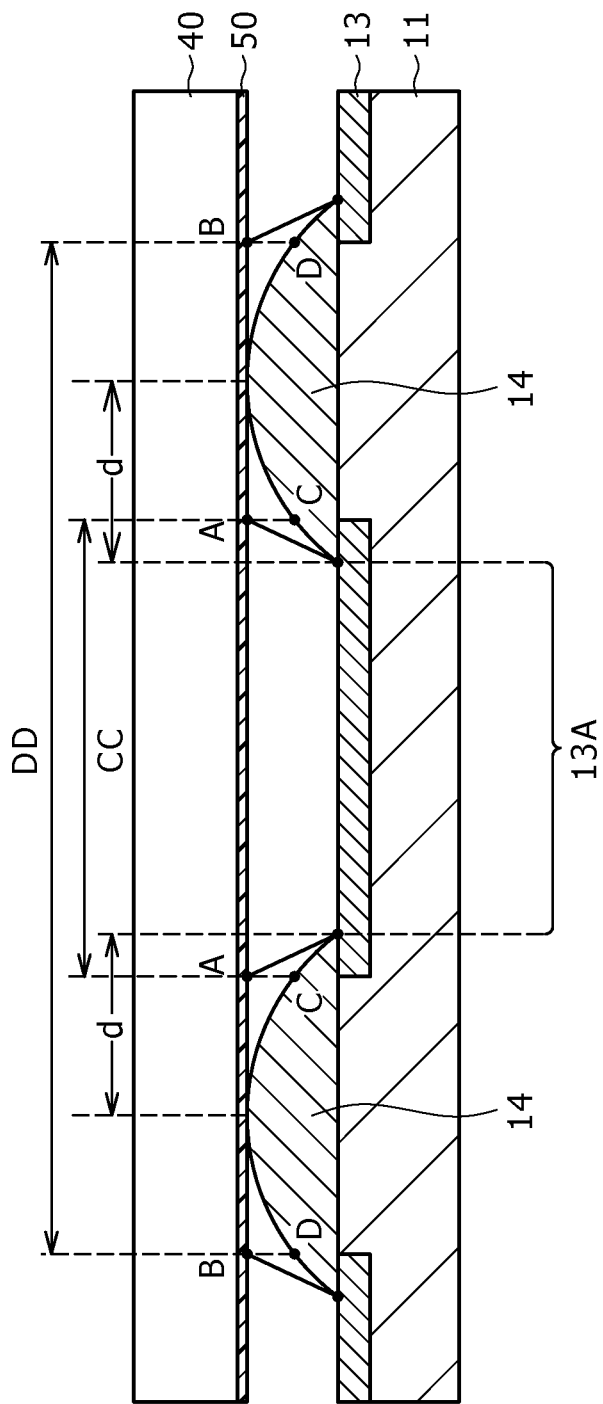
FIG. 8 is a sectional view showing a modification example of the insulating layer shown in FIG. 5.
Figure 9:
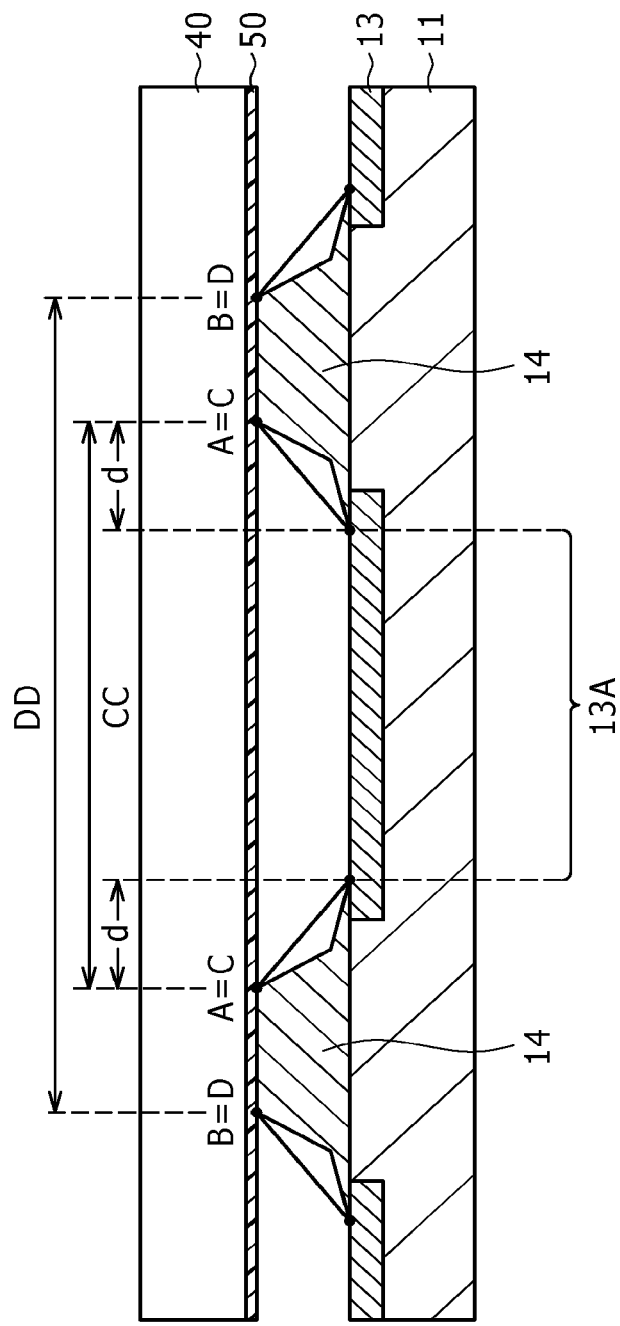
FIG. 9 is a sectional view showing another modification example of the insulating layer shown in FIG. 5.

In the above-described embodiment, the side surface of the insulating layer 14 is an inclined surface. However, the side surface of the insulating layer 14 may have a convex shape like that shown in FIG. 8 or a concave shape like that shown in FIG. 9. That is, various modifications are available.

Figure 10:
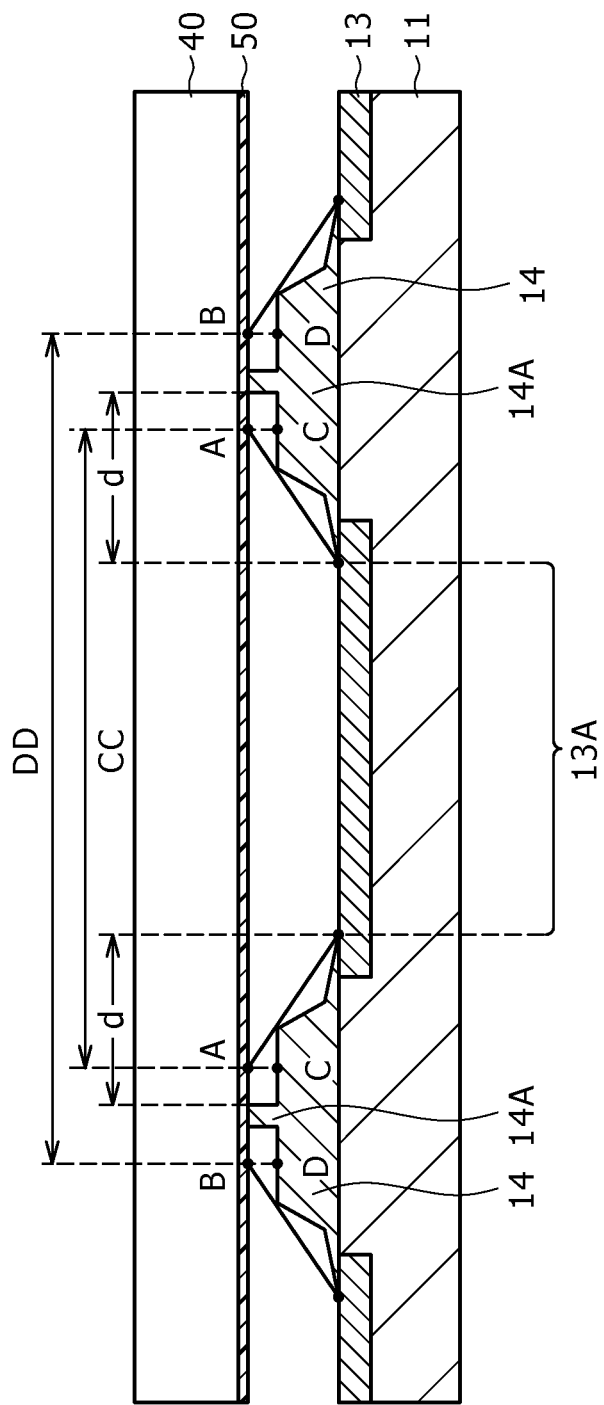
FIG. 10 is a sectional view showing yet another modification example of the insulating layer shown in FIG. 5.
Figure 11:
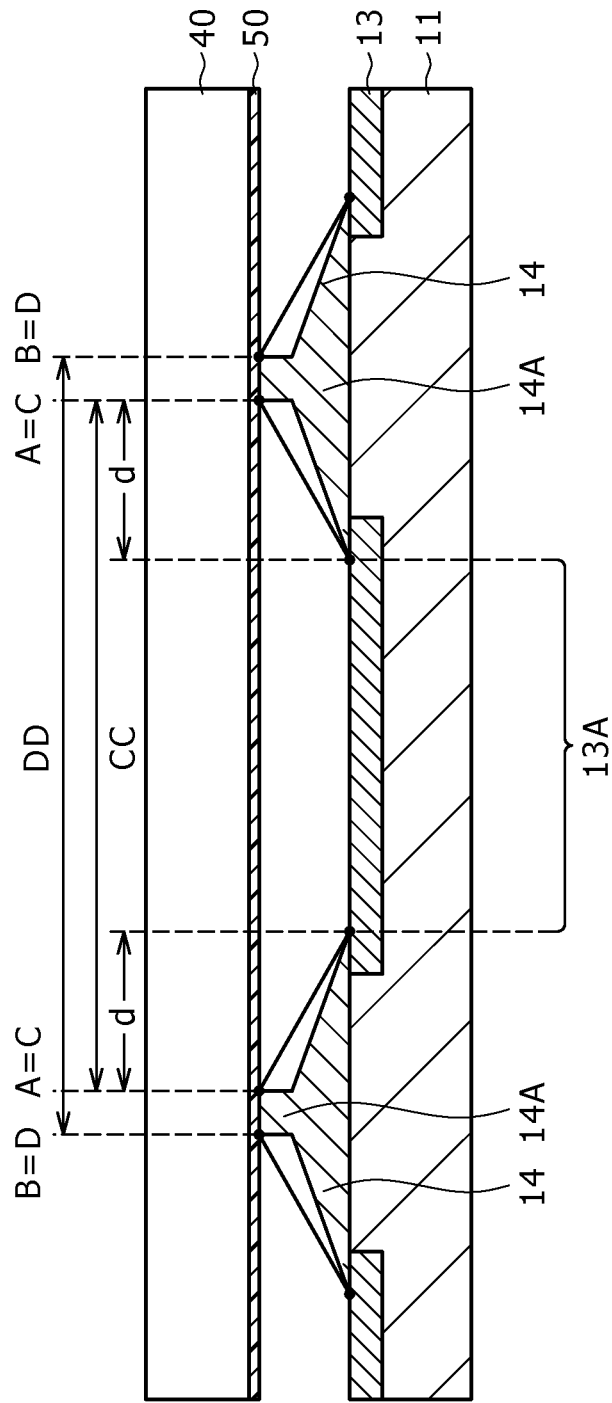
FIG. 11 is a sectional view showing yet another modification example of the insulating layer shown in FIG. 5.
Figures 14A, 14B:
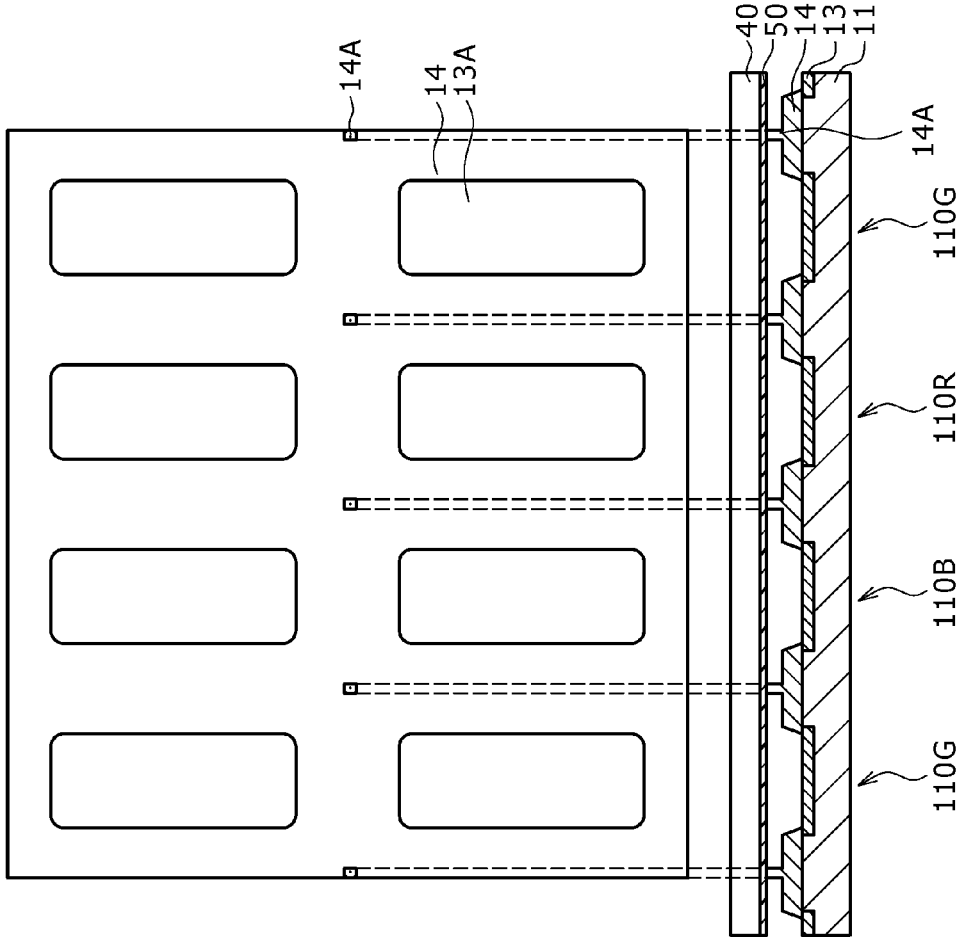
FIGS. 14A and 14B are sectional views showing yet another modification example of the insulating layer shown in FIG. 5.

For example, as shown in FIGS. 10 and 11, a rib (protruding rim or projection) 14A may be provided on the top surface of the insulating layer 14. The rib 14A may extend along both the longitudinal direction and the width direction of the light-emission areas 13A as shown in FIGS. 12A and 12B. Alternatively, it may extend only along the longitudinal direction of the light-emission areas 13A as shown in FIGS. 13A and 13B. More alternatively, it may be provided in a dotted manner as shown in FIGS. 14A and 14B. The rib 14A can be formed by carrying out double exposure in the photolithography step for processing the insulating layer 14.

Figure 15:
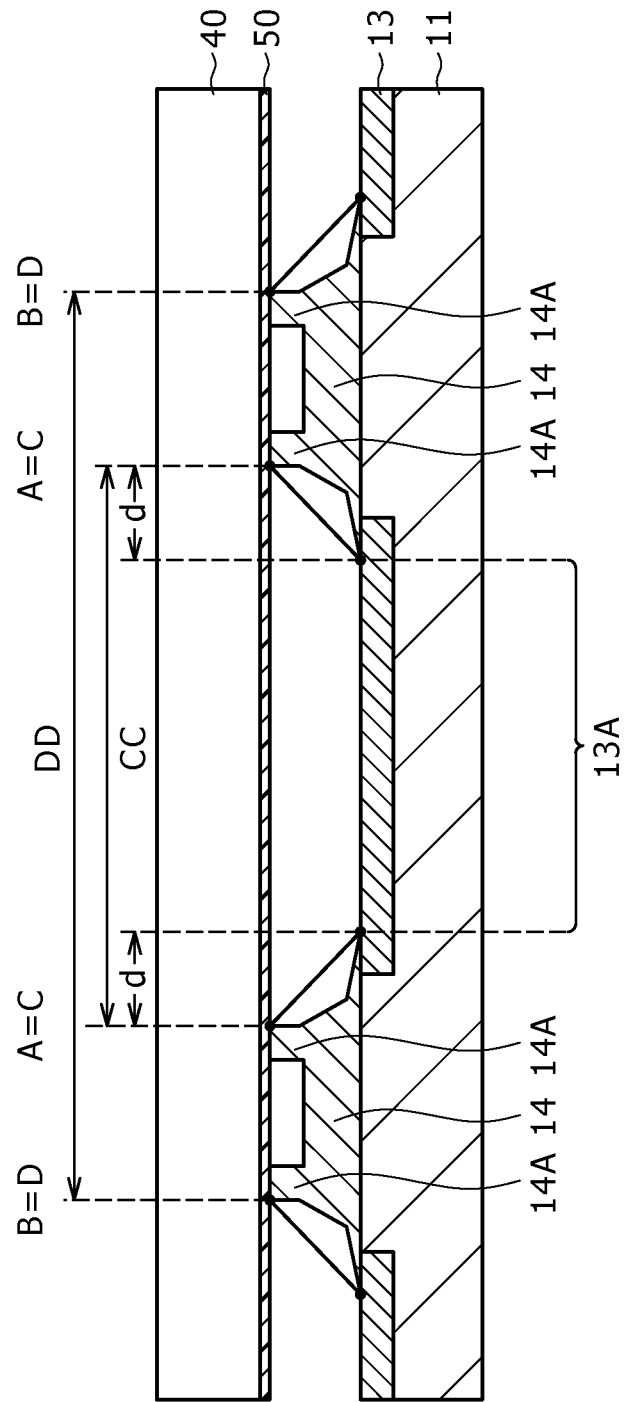
FIG. 15 is a sectional view showing yet another modification example of the insulating layer shown in FIG. 5.

Furthermore, as shown in FIG. 15, the rib 14A may be provided at both the ends of the top surface of each portion of the insulating layer 14. Alternatively, as shown in FIGS. 16 and 17, the shapes of the insulating layer 14 on both the sides of the light-emission area 13A may be different from each other.

Second Embodiment

FIGS. 18A and 18B show the shape of the insulating layer 14 in a display according to a second embodiment of the present invention. In this display, only the light-emitting layer 15C of the organic light-emitting elements 10R and 10G is a transferred light-emitting layer formed by transfer, whereas the light-emitting layer 15C of the organic light-emitting elements 10B is formed by a method other than transfer, such as evaporation. Moreover, if the insulating layer 14 is equally allocated to each of the red, green, and blue light-emitting element columns 110R, 110G, and 110B, the area of the contact face between the insulating layer 14 and the donor substrate 40 in the blue light-emitting element columns 10B (i.e. the area of the top surface of the rib 14A) is the largest. Due to this feature, reverse transfer itself can be suppressed in this display. Thus, the occurrence of streak unevenness and mottled unevenness can be avoided, which allows enhancement in the display quality. Furthermore, the positional accuracy margin of the transfer can be further enlarged, and hence the yield can also be further enhanced.

In the step for forming the light-emitting layer 15C of the organic light-emitting elements 10R and 10G, which is a transferred light-emitting layer, it is preferable to carry out irradiation with laser light except for the contact face between the insulating layer 14 and the donor substrate 40 (the top surface of the rib 14A) to thereby form the light-emitting layer 15C of the organic light-emitting elements 10R and 10G onto the area other than this contact face. This is because such a formation way can transfer the light-emitting layer 15C of the organic light-emitting elements 10R and 10G with almost no reverse transfer caused, and thus allows reduction in the current leakage amount and suppression of the occurrence of display unevenness.

Figures 20A, 20B:
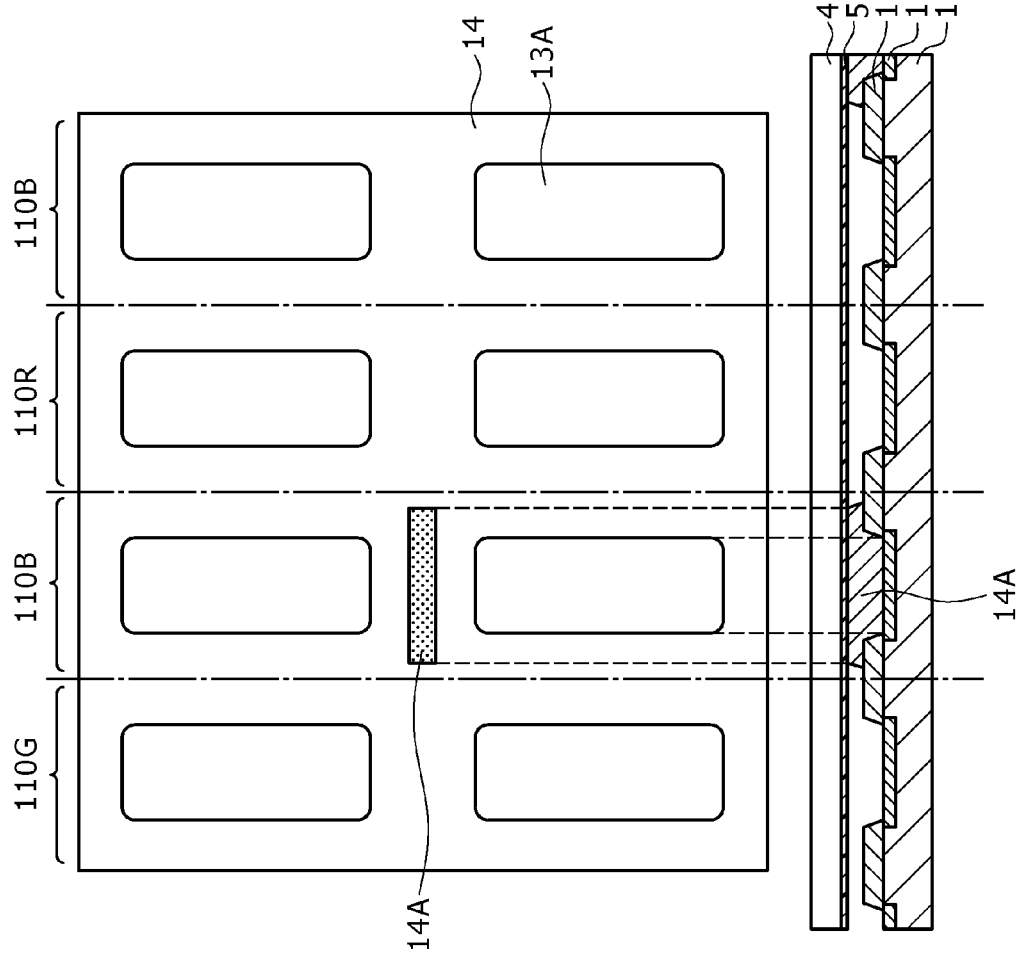
FIGS. 20A and 20B are sectional views showing another modification example of the insulating layer shown in FIGS. 18A and 18B.
Figures 21A, 21B:
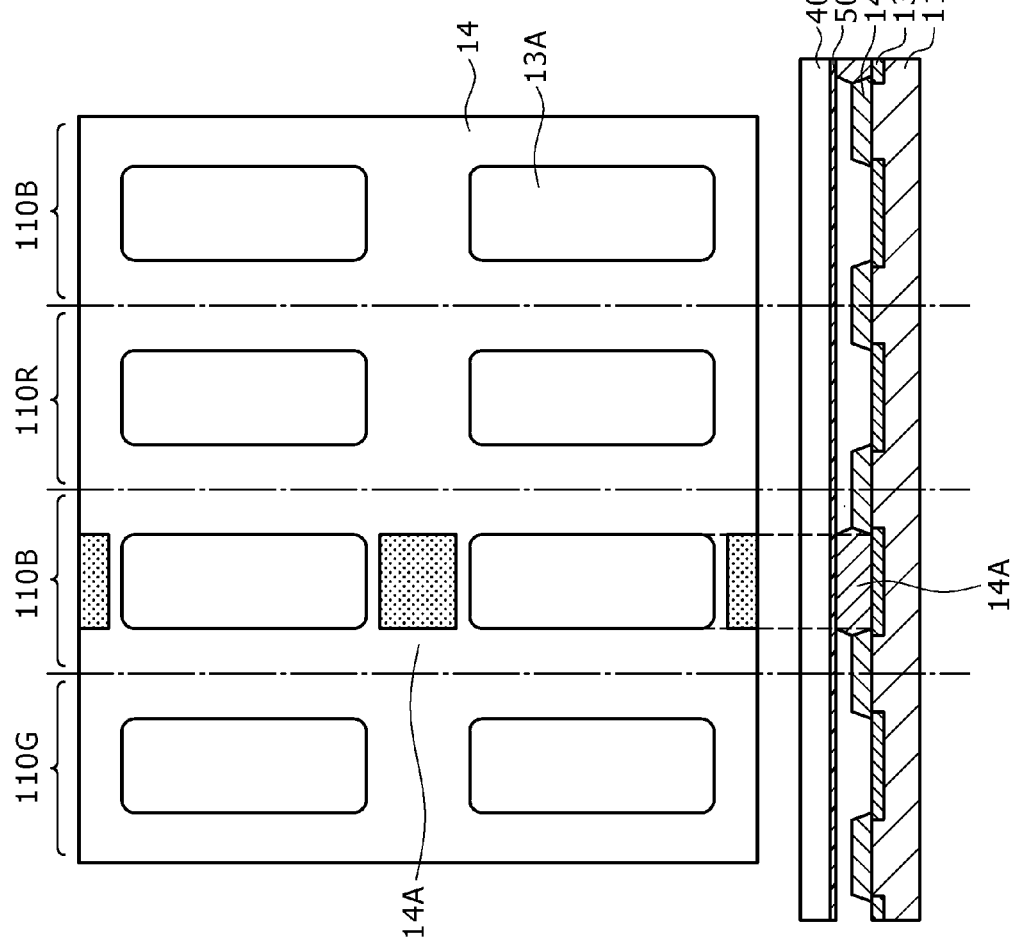
FIGS. 21A and 21B are sectional views showing yet another modification example of the insulating layer shown in FIGS. 18A and 18B.

The rib 14A may extend only along the longitudinal direction of the light-emission areas 13A as shown in FIGS. 18A and 18B. Alternatively, it may extend along both the longitudinal direction and the width direction of the light-emission areas 13A as shown in FIGS. 19A and 19B. More alternatively, it may extend only along the width direction of the light-emission areas 13A as shown in FIGS. 20A and 20B. Further alternatively, it may be provided in a dotted manner as shown in FIGS. 21A and 21B.

WORKING EXAMPLES

Specific working examples of the present invention will be described below.

Working Example 1

Similarly to the first embodiment, a display including the red and blue organic light-emitting elements 10R and 10B was fabricated. In this fabrication, the width of the light-emission area 13A and the distances CC and DD were measured. As a result, the width of the light-emission area 13A was 70 μm, and the distances CC and DD were 78 μm and 122 μm, respectively. The light-emitting layer 15C was formed by transfer for each of the organic light-emitting elements 10R and 10B. The length of the longitudinal axis of the beam spot of laser light was varied to various values in the range of 70 μm to 130 μm, so that the width W of the light-emitting layer 15C along the row direction was varied to various values in the range of 70 μm to 130 μm. The shorter axis of the beam spot of the laser light was fixed to 20 μm, and the laser light was moved for scanning in the direction perpendicular to the longitudinal direction of the beam spot of the laser light. The wavelength and energy density of the laser light were set to 800 nm and 2.6 $E^{-3}$ J/μm$^2$, respectively. The light-emitting layer 15C obtained by the transfer was substantially concentric with the light-emission area 13A.

Working Example 2

A display was fabricated in the same manner as that of Working example 1, except that the rib 14A shown in FIG. 10 was formed on the top surface of the insulating layer 14 and the distances CC and DD were set to 82 μm and 118 μm, respectively.

Regarding the displays obtained as Working examples 1 and 2, the distribution of the film thickness of the light-emitting layer 15C in the light-emission area 13A of the organic light-emitting element 10R and the light-emission efficiency of the organic light-emitting element 10B were investigated. The results are shown in FIG. 22.

Figure 22:
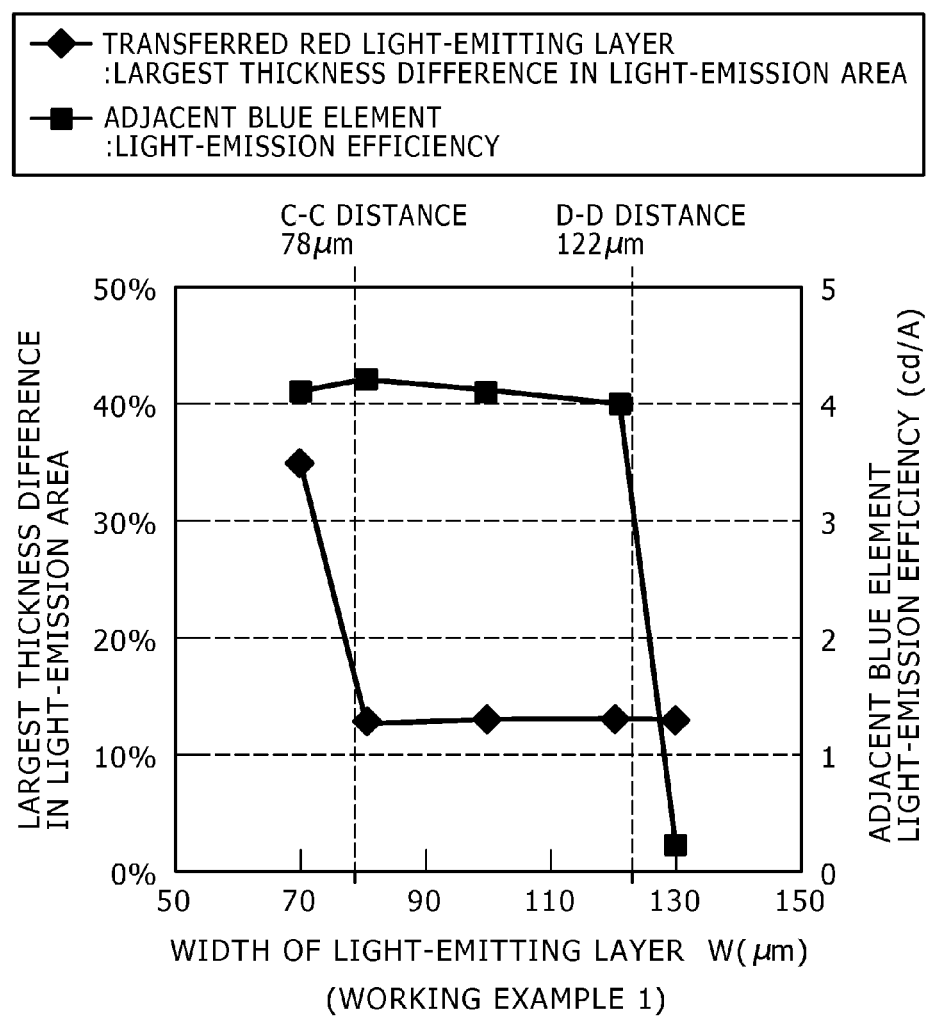
FIG. 22 is a diagram showing results relating to Working example 1.
Figure 23:
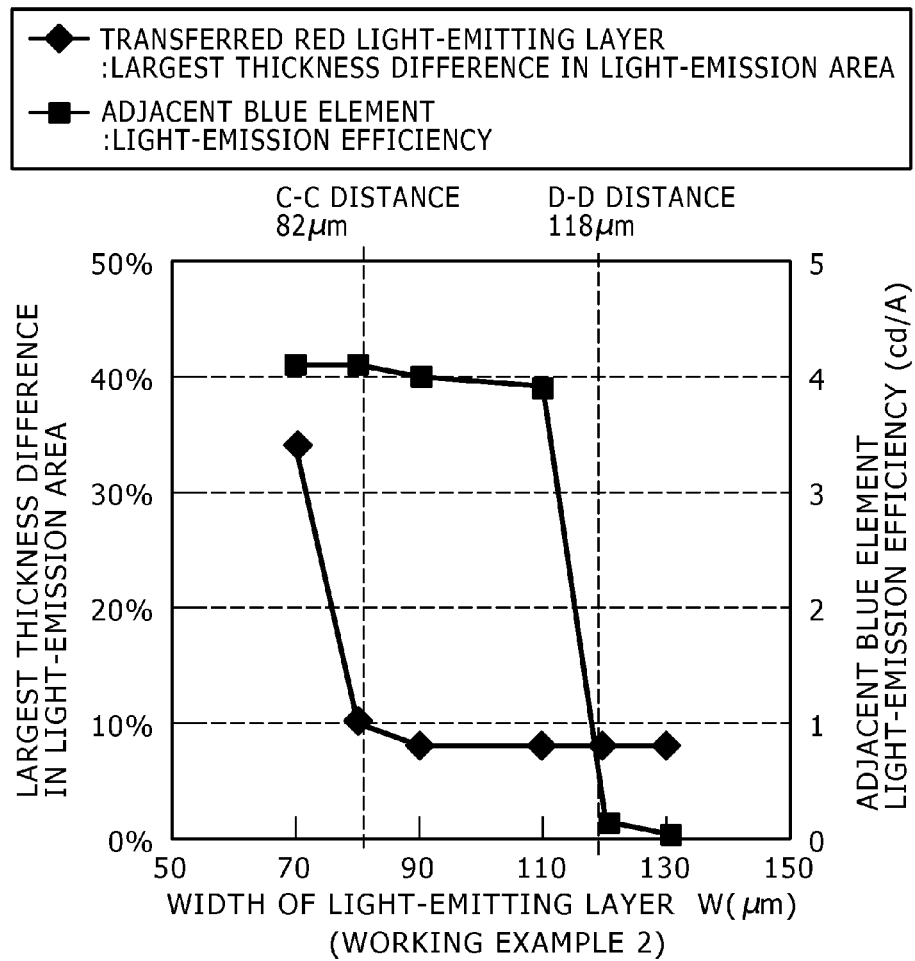
FIG. 23 is a diagram showing results relating to Working example 2.

As is apparent from FIG. 22, if the light-emitting layer 15C did not include C, i.e., if the width W of the light-emitting layer 15C along the row direction was smaller than the distance CC, the distribution of the film thickness of the light-emitting layer 15C in the light-emission area 13A of the organic light-emitting element 10R was significantly wide. This causes in-plane luminance unevenness and chromaticity unevenness. On the other hand, if the light-emitting layer 15C included D, i.e., if the width W of the light-emitting layer 15C along the row direction was larger than the distance DD, the light-emission efficiency of the adjacent organic light-emitting element 10B was significantly low.

That is, it is proved that, if the width W of the light-emitting layer 15C along the row direction is set equal to or larger than CC and smaller than DD, the distribution of the film thickness of the light-emitting layer 15C in the light-emission area 13A and color mixing into the adjacent light-emission area 13A can be suppressed and thus the display quality can be enhanced.

Working Examples 3-1 to 3-4

Similarly to the first embodiment, a display including the red, green and blue organic light-emitting elements 10R, 10G, and 10B was fabricated. In this fabrication, by adjusting the lithography condition for the processing of the insulating layer 14, the distance d along the row direction between an end of the light-emission area 13A and the contact face between the insulating layer 14 and the donor substrate 40 was varied to the following values: 5 μm in Working example 3-1; 4 μm in Working example 3-2; 3 μm in Working example 3-3; and 2 μm in Working example 3-4.

Working Example 4

Similarly to the second embodiment, a display of three colors of red, green, and blue was fabricated. In this fabrication, the distance d was set to 15 μm or longer.

Regarding the displays obtained as Working examples 3-1 to 3-4 and Working example 4, the presence or absence of streak unevenness and mottled unevenness at the time of the lighting of the display was checked. The results are shown in Table 1.

TABLE 1

| | Distance d (μm) | streak unevenness | mottled unevenness |
|---|---|---|---|
| Working example 3-1 | 5 | Absent | Absent |
| Working example 3-2 | 4 | Absent | Absent |
| Working example 3-3 | 3 | Absent | Partially Present |
| Working example 3-4 | 2 | Present | Present |
| Working example 4 | 15 or longer | Absent | Absent |

As is apparent from Table 1, in Working examples 3-1, 3-2, and 4, in which the distance d was set to 4 μm or longer, both streak unevenness and mottled unevenness were favorably suppressed compared with Working examples 3-3 and 3-4, in which the distance d was 3 μm and 2 μm, respectively. This might be because of the following reason. Specifically, in Working examples 3-1 and 3-2, setting the large distance d allowed assuring of a large length of the current leakage path and thus increased the resistance thereof, which resulted in suppression of unevenness. In Working example 4, reverse transfer itself was suppressed. That is, it is proved that setting the distance d to 4 μm or longer can suppress adverse effects such as streak unevenness and mottled unevenness attributed to reverse transfer and thus can enhance the display quality.

Module and Application Examples

Application examples of the displays according to the above-described embodiments will be described below. The displays according to the above-described embodiments can be used as a display part in electronic apparatus in any field that displays, as an image and video, a video signal input thereto from the external or a video signal produced therein, such as a television, digital camera, notebook personal computer, portable terminal apparatus typified by a cellular phone, and video camera.

(Module)

Figure 24:
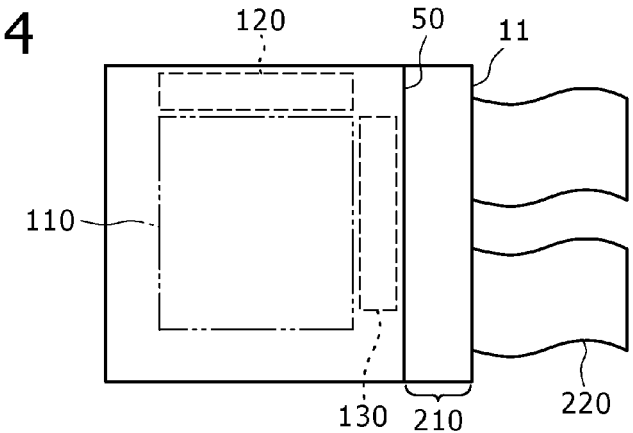
FIG. 24 is a plan view showing the schematic configuration of a module including the display according to an embodiment.

The displays according to the above-described embodiments are incorporated, as e.g. a module shown in FIG. 24, into various kinds of electronic apparatus such as Application examples 1 to 5 to be described later. This module is formed as follows for example. Specifically, an area 210 exposed outside the sealing substrate 30 and the adhesive layer 20 is provided along one side of the acceptor substrate 11. On this exposed area 210, external connection terminals (not shown) are formed by extending the interconnects of the signal line drive circuit 120 and the scan line drive circuit 130. The external connection terminals may be provided with a flexible printed wiring board (flexible printed circuit (FPC)) 220 for input/output of signals.

Application Example 1

Figure 25:
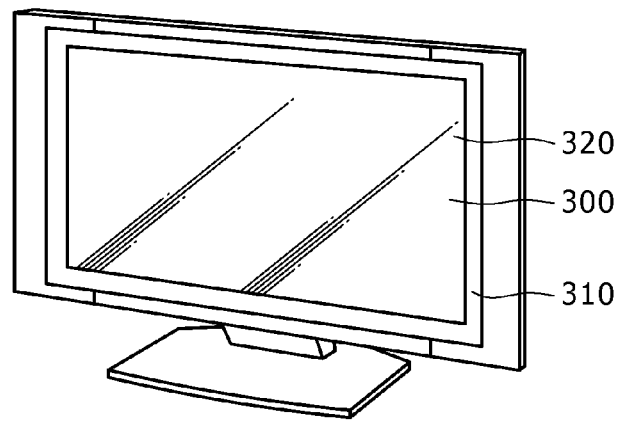
FIG. 25 is a perspective view showing the appearance of Application example 1 of the display according to an embodiment.

FIG. 25 shows the appearance of a television to which the display according to any of the above-described embodiments is applied. This television has e.g. a video display screen 300 including a front panel 310 and a filter glass 320, and this video display screen 300 is formed of the display according to any of the above-described embodiments.

Application Example 2

Figure 26A:
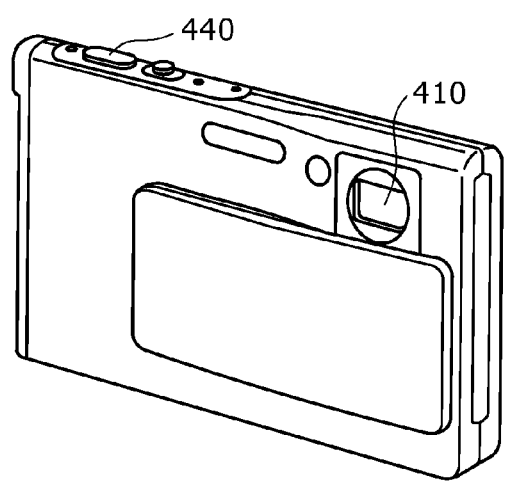
FIGS. 26A and 26B are perspective views showing the appearance of the front side and rear side, respectively, of Application example 2 of the display.
Figure 26B:
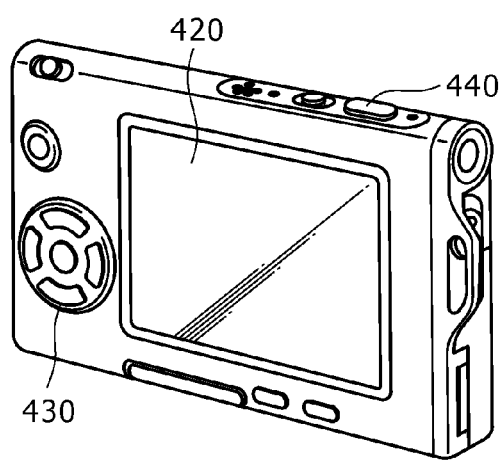

FIGS. 26A and 26B show the appearance of a digital camera to which the display according to any of the above-described embodiments is applied. This digital camera includes e.g. a light emitter 410 for flash, a display part 420, a menu switch 430, and a shutter button 440. This display part 420 is formed of the display according to any of the above-described embodiments.

Application Example 3

Figure 27:
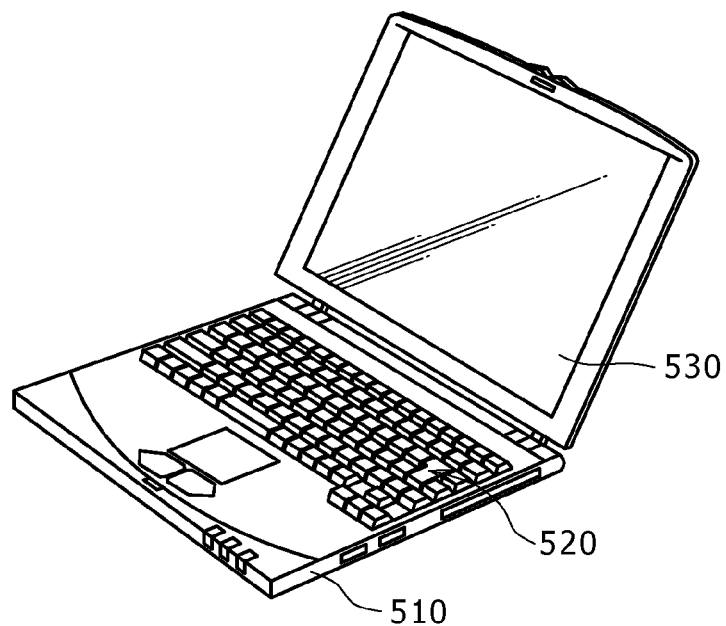
FIG. 27 is a perspective view showing the appearance of Application example 3 of the display.

FIG. 27 shows the appearance of a notebook personal computer to which the display according to any of the above-described embodiments is applied. This notebook personal computer includes e.g. a main body 510, a keyboard 520 for operation of inputting characters and so on, and a display part 530 for displaying images. This display part 530 is formed of the display according to any of the above-described embodiments.

Application Example 4

Figure 28:
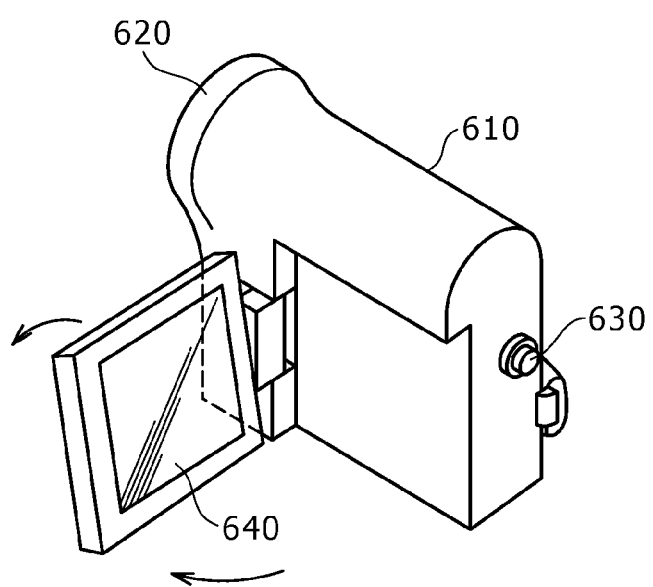
FIG. 28 is a perspective view showing the appearance of Application example 4 of the display.

FIG. 28 shows the appearance of a video camera to which the display according to any of the above-described embodiments is applied. This video camera includes e.g. a main body 610, a lens 620 that is disposed on the front side of the main body 610 and used to capture a subject image, a start/stop switch 630 for imaging operation, and a display part 640. This display part 640 is formed of the display according to any of the above-described embodiments.

Application Example 5

FIGS. 29A to 29G show the appearance of a cellular phone to which the display according to any of the above-described embodiments is applied. This cellular phone is formed e.g. by connecting an upper casing 710 with a lower casing 720 by a connection (hinge) 730, and includes a display 740, a sub-display 750, a picture light 760, and a camera 770. The display 740 and the sub-display 750 are formed of the displays according to any of the above-described embodiments.

This is the end of the description of embodiments and working examples of the present invention. However, the present invention is not limited to the above-described embodiments and working examples but can be variously modified. For example, in the above-described embodiments and working examples, irradiation with laser light is carried out in the transfer step. However, irradiation with another radiant ray such as a ray from a lamp may be carried out.

In the above-described first embodiment, three times of transfer are carried out in matching with the number of light-emission colors. However, also in the first embodiment, a blue common layer may be deposited by evaporation across the entire surface after only the light-emitting layer 15C for red and green is formed by a thermal transfer method, similarly to the second embodiment. In this case, in the organic light-emitting element 10R, the light-emitting layer 15C containing a red light-emitting material and the blue common layer containing a blue light-emitting material are formed. However, red light emission is dominant in the organic light-emitting element 10R because energy is shifted for red, which corresponds to the lowest energy level, in the organic light-emitting element 10R. In the organic light-emitting element 10G, the light-emitting layer 15C containing a green light-emitting material and the blue common layer containing the blue light-emitting material are formed. However, green light emission is dominant in the organic light-emitting element 10G because energy is shifted for green, which corresponds to the lower energy level, in the organic light-emitting element 10G. In the organic light-emitting element 10B, blue light emission occurs because it includes only the blue common layer.

There is no limitation on the materials and thicknesses of the respective layers, the film deposition methods, the film deposition conditions, the conditions of the irradiation with laser light, and so on, shown for the above-described embodiments and working examples. Other materials, thicknesses, deposition methods, deposition conditions, and irradiation conditions may be employed. For example, the first electrode 13 may be composed of IZO (indium-zinc composite oxide), instead of ITO. Alternatively, the first electrode 13 may be formed of a reflective electrode. In this case, it is desirable that the first electrode 13 have a thickness in the range of e.g. 100 nm to 1000 nm and as high reflectivity as possible, in terms of achievement of high light-emission efficiency. Examples of the material of the first electrode 13 include elemental metals such as chromium (Cr), gold (Au), platinum (Pt), nickel (Ni), copper (Cu), tungsten (W), and silver (Ag), and alloys of any of these metals. More alternatively, the first electrode 13 may have e.g. a dielectric multilayer film.

In addition, in the above-described embodiments, the first electrode 13, the organic layer 15, and the second electrode 16 are stacked over the acceptor substrate 11 in that order from the substrate side, and light is extracted through the sealing substrate 30. However, the stacking order may be reversed. Specifically, a configuration is also available in which the second electrode 16, the organic layer 15, and the first electrode 13 are stacked over the acceptor substrate 11 in that order from the substrate side and light is extracted through the acceptor substrate 11.

Moreover, in the above-described embodiments, the first electrode 13 is used as the anode and the second electrode 16 is used as the cathode. However, the anode and the cathode may be interchanged with each other: the first electrode 13 may be used as the cathode and the second electrode 16 may be used as the anode. Furthermore, it is also possible to employ a configuration in which the first electrode 13 is used as the cathode and the second electrode 16 is used as the anode, and the second electrode 16, the organic layer 15, and the first electrode 13 are stacked over the acceptor substrate 11 in that order from the substrate side, and light is extracted through the acceptor substrate 11.

In addition, although the specific configurations of the organic light-emitting elements 10R, 10G, and 10B are shown for the above-described embodiments, all of the layers do not need to be provided but another layer may be further provided. For example, between the first electrode 13 and the organic layer 15, a hole-injection thin layer composed of chromium oxide (III) ($Cr_2O_3$), indium tin oxide (ITO: a mixed film of oxides of indium (In) and tin (Sn)), or the like may be formed.

Furthermore, in the above-described embodiments, the second electrode 16 is formed of a semi-transmissive electrode and light generated by the light-emitting layer 15C is extracted through the second electrode 16. Alternatively, the generated light may be extracted through the first electrode 13. In this case, it is desirable that the second electrode 16 have as high reflectivity as possible in terms of achievement of high light-emission efficiency.

Furthermore, although the above-described embodiments are applied to an active-matrix display, the embodiments can be applied also to a passive-matrix display. Moreover, the configuration of the pixel drive circuit for active-matrix driving is not limited to that shown for the above-described embodiments, but a capacitive element and a transistor may be added to the circuit according to need. In this case, according to the change of the pixel drive circuit, a necessary circuit may be added in addition to the above-described signal line drive circuit 120 and scan line drive circuit 130.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display including organic light-emitting elements formed on an acceptor substrate, the organic light-emitting elements including a plurality of organic red light-emitting elements arranged in a first column, a plurality of organic green light-emitting elements arranged in a second column, and a plurality of organic blue light-emitting elements arranged in a third column, the display formed by a process comprising:

forming a donor including a transfer layer;

forming on the acceptor substrate, for each of the organic light-emitting elements, a first electrode and an insulating layer having an aperture corresponding to a light-emission area of the first electrode;

transferring the transfer layer to the acceptor substrate to form a light-emitting layer of an organic layer of each of the organic light-emitting elements in at least the first column and the second column; and forming a second electrode on the organic layer, wherein a first A point on the donor is where a tangent line of the insulating layer is drawn from a first side end of a first light-emission area to intersect with the donor, a first C point over the insulating layer is at first A Point or vertically below first A point over an upper surface of the insulating layer, and the light-emitting layer is formed over the insulating layer to cover at least first C point designated over the insulating layer, and wherein a contact area between the insulating layer and the donor in the third column that includes the organic blue light-emitting elements is larger than contact area in the first column that includes the organic red light-emitting elements and the contact area in the second column that includes the organic green light-emitting elements.

2. The display according to claim 1, wherein a first B point on the donor is where a tangent line of the insulating layer is drawn from a right-side end of a second light-emission area positioned left-adjacent to the first light-emission area to intersect with the donor, a first D point over the insulating layer is at first B point or vertically below first B point over the upper surface of the insulating layer, and the light-emitting layer is formed over the insulating layer while not covering first D point designated over the insulating layer.

3. The display according to claim 2 wherein a second A point on the donor is where a tangent line of the insulating layer is drawn from a right-side end of the first light-emission area to intersect with the donor, and a second C point over the insulating layer is at second A point or vertically below second A point over the upper surface of the insulating layer, wherein a second B point on the donor is where a tangent line of the insulating layer is drawn from a first side end of a third light-emission area positioned right-adjacent to the first light-emission area to intersect with the donor, a second D point over the insulating layer is at second B point or vertically below second B point over the upper surface of the insulating layer, and wherein a distance CC is a distance between the first C point and the second C point, a distance DD is a distance between the first D point and the second D point, and a width of the transferred light-emitting layer along the row direction corresponding to the first light-emission area is greater than or equal to the distance CC and less than the distance DD.

4. The display according to claim 1, wherein a distance along the row direction between an end of the first light-emission area and a contact face between the insulating layer and the donor is greater than or equal to 4 μm.

5. The display according to claim 1, wherein the transferred light-emitting layer is formed on an area other than a contact face between the insulating layer and the donor.

6. The display according to claim 1, wherein a rib is located over the insulating layer in the third column that includes the organic blue light-emitting elements, and an upper surface of the rib contacts the donor.

* * * * *